United States Patent
Sato et al.

(10) Patent No.: US 6,693,344 B1
(45) Date of Patent: Feb. 17, 2004

(54) SEMICONDUCTOR DEVICE HAVING LOW AND HIGH BREAKDOWN VOLTAGE TRANSISTORS

(75) Inventors: Kimitoshi Sato, Hyogo (JP); Fumitoshi Yamamoto, Hyogo (JP); Hiroshi Onoda, Hyogo (JP); Yasunori Yamashita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 2 days.

(21) Appl. No.: 09/642,225

(22) Filed: Aug. 21, 2000

(30) Foreign Application Priority Data

Mar. 27, 2000 (JP) ........................................ 2000-086496

(51) Int. Cl.$^7$ ........................ H01L 29/00; H01L 27/082
(52) U.S. Cl. ........................ 257/553; 257/566; 257/565; 438/357
(58) Field of Search .............................. 257/370, 375, 257/553, 555, 565, 566, 574–576; 438/309, 322, 323, 340, 357, 358, 416, 419, 554

(56) References Cited

U.S. PATENT DOCUMENTS

| 4,994,400 | A | * | 2/1991 | Yamaguchi et al. | 437/31 |
|---|---|---|---|---|---|
| 5,010,026 | A | * | 4/1991 | Gomi | 437/31 |
| 5,194,926 | A | * | 3/1993 | Hayden | 257/565 |
| 5,336,632 | A | * | 8/1994 | Imamura | 437/60 |
| 5,504,364 | A | * | 4/1996 | Chang et al. | 257/370 |
| 5,541,124 | A | * | 7/1996 | Miwa et al. | 257/518 |
| 5,824,589 | A | * | 10/1998 | Miwa | 438/309 |
| 5,843,814 | A | * | 12/1998 | Manning | 438/202 |
| 6,034,402 | A | * | 3/2000 | Ammo et al. | 257/370 |
| 6,255,716 | B1 | * | 7/2001 | Jeon | 257/587 |
| 6,352,887 | B1 | * | 3/2002 | Hutter et al. | 438/202 |

FOREIGN PATENT DOCUMENTS

| JP | 59-11667 | | 1/1984 | |
| JP | 1-246874 | * | 10/1989 | H01L/29/72 |

* cited by examiner

Primary Examiner—Ori Nadav
(74) Attorney, Agent, or Firm—McDermott, Will & Emery

(57) ABSTRACT

A base of a low breakdown voltage npn bipolar transistor has p$^+$ diffusion layers. A field insulating layer is formed on the p$^+$ diffusion layer located between the p$^+$ diffusion layer and an emitter, while the p$^+$ diffusion layer encloses the surface of the emitter and has a window part immediately under the emitter. Thus, a semiconductor device and a method of fabricating the same capable of suppressing dispersion of a current amplification factor $h_{FE}$ in a wafer plane of the low breakdown voltage transistor and fabricating the low breakdown voltage transistor and a high breakdown voltage transistor through simple steps are obtained.

5 Claims, 30 Drawing Sheets

US 6,693,344 B1

SEMICONDUCTOR DEVICE HAVING LOW AND HIGH BREAKDOWN VOLTAGE TRANSISTORS

BACKGROUND OF THE INVENTION

1. Field of the Invention

The present invention relates to a semiconductor device and a method of fabricating the same, and more particularly, it relates to a semiconductor device having low and high breakdown voltage transistors.

2. Description of the Prior Art

A semiconductor device comprising transistors employed for driving/controlling a motor or an air bag for a car, for example, is described as an exemplary conventional semiconductor device. In this type of semiconductor device, low and high breakdown voltage bipolar transistors and a CMOS (complementary metal oxide semiconductor) transistor are formed on the same semiconductor substrate.

The low and high breakdown voltage bipolar transistors are described with reference to the structure of the semiconductor device, and the low and high breakdown voltage bipolar transistors and the CMOS transistor are described with reference to a method of fabricating the semiconductor device.

FIG. 25 is a schematic sectional view showing the structure of a conventional semiconductor device. Referring to FIG. 25, both low and high breakdown voltage npn bipolar transistors are formed on regions of a p-type silicon substrate 109 electrically isolated from the remaining elements by p$^+$ diffusion layers 110 and 111. Each of the low and high breakdown voltage npn bipolar transistors has a collector 108, a base 103a or 103b and an emitter 104.

In the low breakdown voltage npn bipolar transistor, the collector 108 has an n$^+$ diffusion layer 105 formed on the p-type silicon substrate 109, an n$^-$ epitaxial layer 106 formed on the p-type silicon substrate 109, and an n$^-$ diffusion layer 107a and an n$^+$ diffusion layer 107b formed on the surface of the n$^-$ epitaxial layer 106. The base 103a has a p-type diffusion layer 130 formed on the surface of the n$^-$ epitaxial layer 106 and a p$^+$ diffusion layer 102b formed on the surface of the p-type diffusion layer 130. The emitter 104 has an n$^-$ diffusion layer 104a and an n$^+$ diffusion layer 104b formed on the surface of the p-type diffusion layer 130.

Field oxide films 112 are selectively formed to electrically isolate the base 103a, the emitter 104 and the collector 108 from each other. In a region of the low breakdown voltage npn bipolar transistor held between the p$^+$ diffusion layer 102b and the emitter 104, however, no field oxide film 112 is formed on the surface of the p-type diffusion layer 130.

In the high breakdown voltage npn bipolar transistor, the base 103b has a p$^+$ diffusion layer 102a formed on the surface of the n$^-$ epitaxial layer 106 in a larger diffusion depth than the p-type diffusion layer 130, a p$^+$ diffusion layer 102b formed on the surface of the p$^+$ diffusion layer 102a and a p$^+$ diffusion layer 101 enclosing the lower portions of the emitter 104 and the p$^+$ diffusion layer 102b.

Field oxide films 112 are formed on the p$^+$ diffusion layers 101 and 102a held between the p$^+$ diffusion layer 102b and the emitter 104.

The remaining structure of the high breakdown voltage npn bipolar transistor is substantially identical to that of the low breakdown voltage npn bipolar transistor, and hence components of the high breakdown voltage npn bipolar transistor identical to those of the low breakdown voltage npn bipolar transistor are denoted by the same reference numerals, not to repeat redundant description.

An interlayer isolation layer 113 is formed to cover the low and high breakdown voltage npn bipolar transistors, and electrodes 114 are formed to be electrically connected with the collectors 108, the bases 103a and 103b and the emitters 104 respectively.

A method of fabricating the conventional semiconductor device is now described.

FIGS. 26 to 30 are schematic sectional views successively showing steps in the method of fabricating the conventional semiconductor device. Referring to FIG. 26, the n$^-$ epitaxial layer 106 is formed on the p-type silicon substrate 109 through the n$^+$ diffusion layers 105 and the p$^+$ diffusion layers 110.

Referring to FIG. 27, an n$^-$ diffusion layer 122 is formed on a CMOS transistor region, followed by formation of the p$^+$ diffusion layers 102a and the p$^-$ diffusion layers 111 for element isolation.

Thereafter the field oxide films 112 are selectively formed on the surface of the substrate 109 by a general LOCOS (local oxidation of silicon) method. Thereafter boron ions are selectively implanted thereby forming the p$^+$ diffusion layers 101 in the p$^+$ diffusion layers 102a and 111.

Thin oxide films 121 are formed on portions of the surface of the substrate 109 formed with no field oxide films 112.

Referring to FIG. 28, gate electrodes consisting of films 123 of polycrystalline silicon (hereinafter referred to as doped polysilicon) doped with an impurity and tungsten silicide films 124 are formed on the CMOS transistor region. Thereafter the p-type diffusion layer 130 is formed on the low breakdown voltage npn bipolar transistor region. Further, the n$^-$ diffusion layers 104a and 107a and n$^-$ diffusion layers 125a are formed on the respective transistor regions.

Referring to FIG. 29, a silicon oxide film (not shown) is formed to cover the overall surface and the overall surface of this silicon oxide film is thereafter anisotropically etched for forming side wall insulating layers 126 covering the side surfaces of the gate electrodes 123 and 124. The thin silicon oxide films 121 are removed from the portions formed with no field oxide films 112 by the anisotropic etching for forming the side wall insulating layers 126, for partially exposing the surface of the substrate 109.

In this state, the n$^+$ diffusion layers 104b and 107b and n$^+$ diffusion layers 125b are formed on the respective transistor regions. In order to form these n$^+$ diffusion layers 104b, 107b and 125b, arsenic is implanted into prescribed regions of the semiconductor substrate 109 and thereafter heat treatment is performed at a temperature of 900° C. Thereafter the p$^+$ diffusion layers 102b are formed on the low and high breakdown voltage npn bipolar transistor regions, and p$^+$ diffusion layers 127 for defining source/drain regions are formed on the CMOS transistor region.

Referring to FIG. 30, the interlayer isolation layer 113 is formed to cover the overall surface, and thereafter the electrodes 114 are formed in contact with the respective diffusion layers.

In the aforementioned semiconductor device, the current amplification factor h$_{FE}$ characteristic of the low breakdown voltage npn bipolar transistor remarkably disperses in the wafer plane, and the fabrication steps are disadvantageously complicated. These problems are now described.

The inventors have evaluated collector current I$^C$ dependency of the current amplification factor h$_{FE}$ as to the conventional low breakdown voltage npn bipolar transistor. It has consequently been proved that the current amplification factor $h_{FE}$ remarkably disperses in the wafer plane. FIGS. 31B to 31F show the results.

FIGS. 31B to 31F are graphs showing the results evaluated on five measuring points 1 to 5 in the wafer plane shown in FIG. 31A respectively. It is understood from these graphs that the values of the current amplification factor $h_{FE}$ for a specific collector current $I_C$ vary and disperse in the wafer plane.

The current amplification factor $h_{FE}$ is defined as the ratio $(I_C/I_B)$ of the collector current $I_C$ to a base current $I_B$. In order to investigate the cause for such dispersion of the current amplification factor $h_{FE}$, base-to-emitter voltage $V_{EB}$ dependency of the collector current $I_C$ and base-to-emitter voltage $V_{EB}$ dependency of the base current $I_B$ were evaluated respectively.

Referring to FIG. 32 showing partial results of the evaluation, results on the measuring points 3 and 5 exhibiting the largest changes among the five measuring points 1 to 5 in the wafer plane are plotted on the same graph. As shown in FIG. 32, the curves are substantially consistent with each other as to the base-to-emitter voltage $V_{EB}$ dependency of the collector current $I_C$. Thus, it is conceivable that dispersion of the collector current $I_C$ in the wafer plane is extremely small.

Noting the curves showing the base-to-emitter voltage $V_{EB}$ dependency of the base current $I_B$, however, it is understood that the curves at the measuring points 5 and 3 are inconsistent with each other. In other words, it is understood that the base current $I_B$ disperses in the wafer plane. Thus, it is conceivable that dispersion of the current amplification factor $h_{FE}$ results from such dispersion of the base current $I_B$.

FIG. 33 illustrates respective components flowing in the low breakdown voltage npn bipolar transistor. Referring to FIG. 33, the current components in the bipolar transistor generally includes an electron injection component $I_{diff,B}$ (component 1) into a base, a hole injection component $I_{diff,E}$ (component 2) into an emitter, a recombination component $I_{rec}$ (component 3) in an emitter depletion layer, a recombination component $\alpha_T$ (component 4) in the base and a recombination component $I_{sur}$ (component 5) on the surface of the base.

The quantity of the base current $I_B$ corresponds to the total of the components 2, 3, 4 and 5 among these components. These components are approximately expressed as follows:

$$I_{diff,E} \approx qD_{pE} \frac{n_i^2}{N_{DE} \cdot W_E} \exp\left(\frac{qV_{EB}}{kT}\right) \quad (1)$$

$$I_{rec} \approx \frac{1}{2} q \frac{n_i}{\tau_o} \cdot W_{EB} \cdot \exp\left(\frac{qV_{EB}}{2kT}\right) \quad (2)$$

$$\alpha_T \approx 1 - \frac{1}{2}\left(\frac{W_B}{L_{nB}}\right)^2 \quad (3)$$

$$I_{sur} \approx qS_n \frac{n_i^2}{N_{AB}} \exp\left(\frac{qV_{EB}}{kT}\right) A_s \quad (4)$$

where $D_{pE}$ represents the hole diffusion constant in the emitter, $N_{DE}$ represents the impurity concentration in the emitter, $N_{AB}$ represents the impurity concentration in the base, $S_n$ represents the surface recombination velocity of electrons, $A_S$ represents the effective recombination area, $L_{nB}$ represents the electron diffusion length in the base, $W_E$ represents the emitter width, $W_B$ represents the base width, $W_{EB}$ represents the width of the depletion layer between the emitter and the base, $\tau_o$ represents the effective life in a reverse bias depletion layer, k represents the Boltzmann's constant, $n_i$ represents the electron density in an intrinsic semiconductor, T represents the absolute temperature, and q represents the charge quantity of electrons.

The recombination component (component 4) in the base, reducing by recombination while minority carriers pass through the base, quantitatively expresses the ratio of minority carriers reaching the base and a collector depletion layer among those injected into the base, and can be expressed in the carry-over factor $\alpha_T$.

From the above expressions (1) to (4), it is understood that the impurity concentration $N_{DE}$ in the emitter and the impurity concentration $N_{AB}$ in the base concern with causes for the dispersion of the base current $I_B$.

In the conventional fabrication method, the heat treatment is performed in a nitrogen atmosphere in the step shown in FIG. 29 while exposing the surface of the p-type diffusion layer 130 defining the base of the low breakdown voltage npn bipolar transistor. At this time, boron evaporates (diffuses out) from the surface of the p-type diffusion layer 130. Thus, it is conceivable that the conventional semiconductor device has a structure readily allowing evaporation of boron in the fabrication steps with different quantities in the wafer plane and hence the base current $I_B$ disperses in the wafer plane to result in remarkable dispersion of the current amplification factor $h_{FE}$ in the wafer plane.

In the conventional semiconductor device, the diffusion depths of the p-type diffusion layer 130 and the p⁺ diffusion layer 102a are different from each other, as shown in FIG. 25. Therefore, the p-type diffusion layer 130 and the p⁺ diffusion layer 102a must be formed in different steps (FIGS. 27 and 28), leading to complicated fabrication steps.

SUMMARY OF THE INVENTION

An object of the present invention is to suppress dispersion of a current amplification factor $h_{FE}$ characteristic in a wafer plane.

Another object of the present invention is to fabricate a low breakdown voltage transistor and a high breakdown voltage transistor through simple steps.

A semiconductor device according to the present invention has low and high breakdown voltage transistors formed on a major surface of a semiconductor substrate, and the low breakdown voltage transistor includes a field insulating layer, a base first impurity region of a first conductive type, a emitter first impurity region of a second conductive type and a base second impurity region of a first conductivity type. The field insulating layer is formed on the major surface of the semiconductor substrate. The base first impurity region is formed in a first side of the major surface in first and second sides of the major surface holding at least a part of the field insulating layer therebetween. The emitter first impurity region is formed in the second side of the major surface in the first and second sides of the major surface holding at least the part of the field insulating layer therebetween. The base second impurity region is located between the base first impurity region and the emitter first impurity region and immediately under the field insulating layer.

In the semiconductor device according to the present invention, the field insulating layer is located immediately on the base second impurity region located between the base first impurity region and the emitter first impurity region. Therefore, an impurity such as boron is prevented from evaporating from this portion. Thus, the quantity of an evaporating impurity can be reduced for suppressing increase of dispersion of the current amplification factor $h_{FE}$ in a wafer plane.

In the aforementioned semiconductor device, the low breakdown voltage transistor preferably withstands a voltage of less than 30 V, and the high breakdown voltage transistor preferably withstands a voltage of at least 30 V.

Thus, increase of dispersion of the current amplification factor $h_{FE}$ in the wafer plane can be suppressed in the low breakdown voltage transistor withstanding a voltage of less than 30 V.

In the aforementioned semiconductor device, the low breakdown voltage transistor preferably further includes a base third impurity region of a first conductivity type. The base second impurity region is formed in the major surface to enclose the base first impurity region and the emitter first impurity region, and has a lower impurity concentration than the base first impurity region. The base third impurity region encloses the emitter first impurity region in the major surface in the base second impurity region, has an opening in at least a partial region located immediately under the emitter first impurity region, and has a higher impurity concentration than the base second impurity region.

The base third impurity region thus encloses the emitter first impurity region on the major surface, whereby it is possible to prevent reduction of the emitter-to-collector breakdown voltage resulting from reduction of the surface concentration of the base second impurity region. In other words, reduction of the breakdown voltage can be prevented by providing the base third impurity region having a higher impurity concentration than the base second impurity region and increasing the surface concentration of the base second impurity region.

Further, the field insulating layer can inhibit evaporation of a p-type impurity such as boron in the base second impurity region located on the major surface between the base first impurity region and the emitter first impurity region.

In the aforementioned semiconductor device, the high breakdown voltage transistor preferably includes a base fourth impurity region of a first conductivity type, a emitter second impurity region of a second conductivity type, a base fifth impurity region of a first conductivity type and a base sixth impurity region of a first conductivity type. The base fourth impurity region is formed in the major surface of the semiconductor substrate. The emitter second impurity region is formed in the major surface at a space from the base fourth impurity region. The base fifth impurity region is formed in the major surface to enclose the base fourth impurity region and the emitter second impurity region and to be substantially identical in diffusion depth to the base second impurity region, and has a lower impurity concentration than the base fourth impurity region. The base sixth impurity region encloses the periphery of the emitter second impurity region, and has a higher impurity concentration than the base fifth impurity region.

Thus, the base fifth impurity region and the base second impurity region can be formed in the same step by setting the base fifth impurity region of the high breakdown voltage transistor at a diffusion depth substantially identical to that of the base second impurity region of the low breakdown voltage transistor. Therefore, the fabrication steps can be simplified.

In the aforementioned semiconductor device, the low breakdown voltage transistor preferably further includes a second conductivity type collector impurity region. The base second impurity region encloses the overall portion of the emitter first impurity region located under the major surface, and is electrically connected to the base first impurity region. The collector impurity region is in contact with the base second impurity region. The junction between the base second impurity region and the collector impurity region has an irregular part reflecting an irregular shape formed by the first side of the major surface, the second side of the major surface and the upper surface of at least the part of the field insulating layer.

Thus, the field insulating layer can suppress evaporation of a p-type impurity such as boron in the base second impurity region located on the major surface between the base first impurity region and the emitter first impurity region.

In the aforementioned semiconductor device, the high breakdown voltage transistor preferably includes a base third impurity region of a first conductivity type, a emitter second impurity region of a second conductivity type, a base fourth impurity region of a first conductivity type and a base fifth impurity region of a first conductivity type. The base third impurity region is formed in the major surface of the semiconductor substrate. The emitter second impurity region is formed in the major surface at a space from the base third impurity region. The base fourth impurity region is formed in the major surface of the semiconductor substrate to enclose the base third impurity region and the emitter second impurity region, and has a lower impurity concentration than the base third impurity region. The base fifth impurity region encloses the periphery of the emitter second impurity region, and has a higher impurity concentration than the base fourth impurity region.

Thus, the low breakdown voltage transistor has no layer corresponding to the base fourth impurity region of the high breakdown voltage transistor, and hence the base fourth impurity region and a region of the low breakdown voltage transistor corresponding thereto may not be formed in different steps. Therefore, the fabrication steps can be simplified.

A method of fabricating a semiconductor device according to the present invention is a method of fabricating a semiconductor device having low and high breakdown voltage transistors formed on a major surface of a semiconductor substrate, and a step of forming the low breakdown voltage transistor includes the following steps:

First, a field insulating layer is selectively formed on the major surface. A base first impurity region of a first conductivity type is formed in a first side of the major surface in first and second sides of the major surface holding at least a part of the field insulating layer therebetween, and a emitter first impurity region of a second conductivity type is formed in the second side of the major surface. A base second impurity region of a first conductivity type located at least immediately under the field insulating layer is formed either before or after formation of the field insulating layer.

In the method of fabricating a semiconductor device according to the present invention, the field insulating layer is located immediately on the base second impurity region held between the base first impurity region and the emitter first impurity region. Therefore, an impurity such as boron is prevented from evaporating from this portion. Thus, the quantity of an evaporating impurity can be reduced for suppressing increase of dispersion of the current amplification factor $h_{FE}$ in the wafer plane.

In the aforementioned method of fabricating a semiconductor device, the low breakdown voltage transistor preferably withstands a voltage of less than 30 V, and the high breakdown voltage transistor preferably withstands a voltage of at least 30 V.

Thus, increase of dispersion of the current amplification factor $h_{FE}$ in the wafer plane can be suppressed in the low breakdown voltage transistor withstanding a voltage of less than 30 V.

In the aforementioned method of fabricating a semiconductor device, the base second impurity region is preferably formed on the major surface before forming the field insulating layer. The base first impurity region, the emitter first impurity region and at least the part of the field insulating layer are formed on the major surface in the base second impurity region.

Thus, the field insulating layer can suppress evaporation of a p-type impurity such as boron in the base second impurity region located on the major surface between the base first impurity region and the emitter first impurity region.

In the aforementioned method of fabricating a semiconductor device, the step of forming the low breakdown voltage transistor preferably further includes a step of forming a base third impurity region of a first conductivity type having a higher impurity concentration than the base second impurity region to enclose a region formed with the emitter first impurity region on the major surface in the base second impurity region and to have an opening at least in a partial region located immediately under the emitter first impurity region after formation of the field insulating layer.

Thus, the base third impurity region encloses the emitter first impurity region on the major surface, whereby it is possible to prevent reduction of the emitter-to-collector breakdown voltage resulting from reduction of the surface concentration of the base second impurity region. In other words, reduction of the breakdown voltage can be prevented by providing the base third impurity region having a higher impurity concentration than the base second impurity region and increasing the surface concentration of the base second impurity region.

In the aforementioned method of fabricating a semiconductor device, a step of forming the high breakdown voltage transistor preferably includes steps of forming a base fourth impurity region of a first conductivity type in the major surface in the same step as that for the base first impurity region, forming a emitter second impurity region of a second conductivity type in the major surface at a space from the base fourth impurity region in the same step as that for the emitter first impurity region, forming a base fifth impurity region of a first conductivity type in the major surface to enclose the base fourth impurity region and the emitter second impurity region in the same step as that for the base second impurity region, and forming a base sixth impurity region of a first conductivity type to enclose the emitter second impurity region in the same step as that for the base third impurity region.

Thus, the base fifth impurity region of the high breakdown voltage transistor is formed in the same step as that for the base second impurity region of the low breakdown voltage transistor, whereby the fabrication steps can be simplified.

In the aforementioned method of fabricating a semiconductor device, the step of forming the low breakdown voltage transistor preferably further includes a step of forming a collector impurity region of a second conductivity type before formation of the field insulating layer. The base second impurity region is formed to enclose the emitter first impurity region so that the junction between the base second impurity region and the collector impurity region has an irregular part reflecting an irregular shape formed by the first side of the major surface, the second side of the major surface and the upper surface of at least the part of the field insulating layer after formation of the field insulating layer.

Thus, the field insulating layer can suppress evaporation of a p-type impurity such as boron in the base second impurity region located on the major surface between the base first impurity region and the emitter first impurity region.

In the aforementioned method of fabricating a semiconductor device, a step of forming the high breakdown voltage transistor preferably includes steps of forming a base third impurity region of a first conductivity type in the major surface in the same step as that for the base first impurity region, forming a emitter second impurity region of a second conductivity type in the major surface at a space from the base third impurity region in the same step as that for the emitter first impurity region, forming a base fourth impurity region of a first conductivity type in the major surface to enclose the base third impurity region and the emitter second impurity region after formation of the collector impurity region and before formation of the field insulating layer and forming a base fifth impurity region of a first conductivity type to enclose the emitter second impurity region and to have a higher impurity concentration than the base fourth impurity region in the same step as that for the base second impurity region.

Thus, the low breakdown voltage transistor has no layer corresponding to the base fourth impurity region of the high breakdown voltage transistor, whereby the base fourth impurity region and a region of the low breakdown voltage transistor corresponding thereto may not be formed in different steps. Therefore, the fabrication steps can be simplified.

Throughout the specification, the term "field insulating layer" indicates an insulating layer such as a field oxide film formed by a method equivalent to the LOCOS method.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments of the present invention are now described with reference to the drawings.

(First Embodiment)

Figure 1:
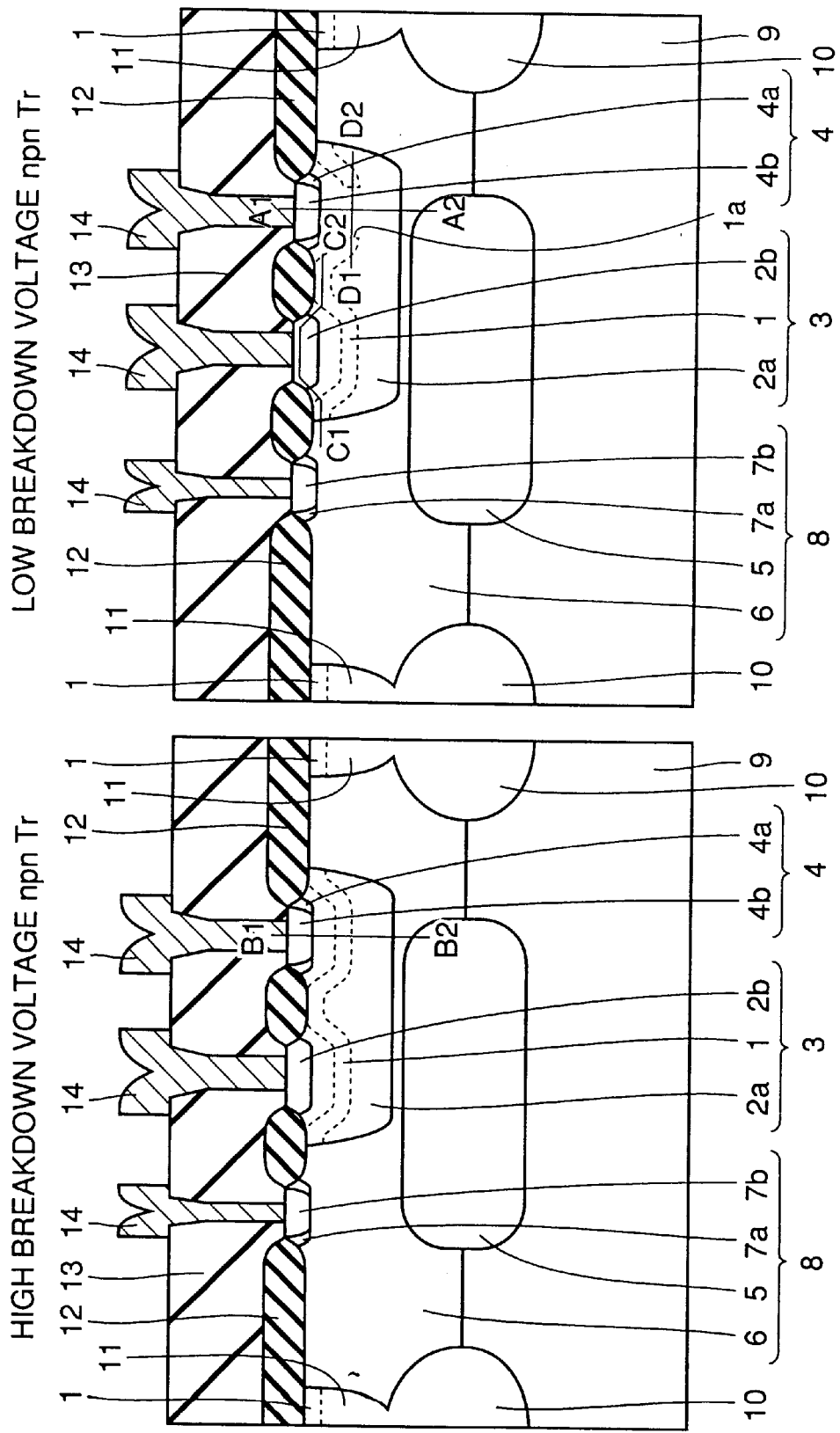
FIG. 1 is a sectional view schematically showing the structure of a semiconductor device according to a first embodiment of the present invention.

Referring to FIG. 1, a semiconductor device according to a first embodiment of the present invention has low and high breakdown voltage npn bipolar transistors, for example. The low breakdown voltage npn bipolar transistor withstands a voltage of less than 30 V, and the high breakdown voltage npn bipolar transistor withstands a voltage of at least 30 V. Each of the low and high breakdown voltage npn transistors is formed on regions of a p-type silicon substrate 9 electrically isolated by $p^+$ diffusion layers 10 and 11, and has a collector 8, a base 3 and an emitter 4.

In the low breakdown voltage npn bipolar transistor, the collector 8 has an $n^+$ diffusion layer 5, an $n^-$ epitaxial layer 6 formed on the p-type silicon substrate 9 through the $n^+$ diffusion layer 5, and an $n^-$ diffusion layer 7a and an $n^+$ diffusion layer 7b formed on the surface of the $n^-$ epitaxial layer 6.

The base 3 has a $p^+$ diffusion layer 2a formed on the surface of the $n_-$ epitaxial layer 6, a $p^+$ diffusion layer 2b formed on the surface of the $p^+$ diffusion layer 2a and a $p^+$ diffusion layer 1 formed in the $p^+$ diffusion layer 2a. The $p^+$ diffusion layers 2b and 1 have higher impurity concentrations than the $p^+$ diffusion layer 2a.

The emitter 4 has an $n^-$ diffusion layer 4a and an $n^+$ diffusion layer 4b formed on the surface of the $p^+$ diffusion layer 2a.

Field oxide films 12, selectively formed to electrically isolate the base 3, the emitter 4 and the collector 8 from each other, are also formed on the $p^+$ diffusion layers 1 and 2a held between the $p^+$ diffusion layer 2b and the emitter 4.

Figure 2:
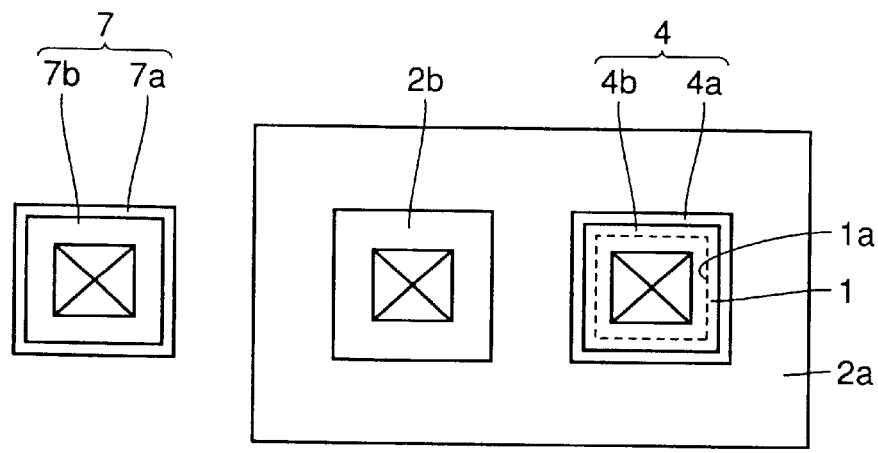
FIG. 2 is a plan view of a low breakdown voltage npn bipolar transistor shown in FIG. 1.

Referring to FIG. 2, the $p^+$ diffusion layer 1 encloses the periphery of the emitter 4 on the surface of the $p^+$ diffusion layer 2a, and has a window part (opening) 1a in a partial region located immediately under the emitter 4.

Referring again to FIG. 1, the base 3 of the high breakdown voltage npn bipolar transistor has a $p^+$ diffusion layer 2a formed on the surface of the $n^-$ epitaxial layer 6, a $p^+$ diffusion layer 2b formed on the surface of the $p^+$ diffusion layer 2a and a $p^+$ diffusion layer 1 completely covering the lower portions of the $p^+$ diffusion layer 2b and the emitter 4. The $p^+$ diffusion layer 1 has no window part dissimilarly to the $p^+$ diffusion layer 1 of the low breakdown voltage npn bipolar transistor. The $p^+$ diffusion layers 2b and 1 have higher impurity concentrations than the $p^+$ diffusion layer 2a.

The remaining structure of the high breakdown voltage npn bipolar transistor is substantially identical to the aforementioned structure of the low breakdown voltage npn bipolar transistor, and hence components of the high breakdown voltage npn bipolar transistor identical to those of the low breakdown voltage npn bipolar transistor are denoted by the same reference numerals, not to repeat redundant description.

An interlayer isolation layer 13 is formed on the low and high breakdown voltage npn bipolar transistors, with electrodes 14 to be electrically connected with the collectors 8, the bases 3 and the emitters 4 respectively.

The $p^+$ diffusion layers 1 are formed on the surfaces of the $p^+$ diffusion layers 11.

Impurity concentration distributions in the respective portions of the semiconductor device according to this embodiment are now described.

Figure 3:
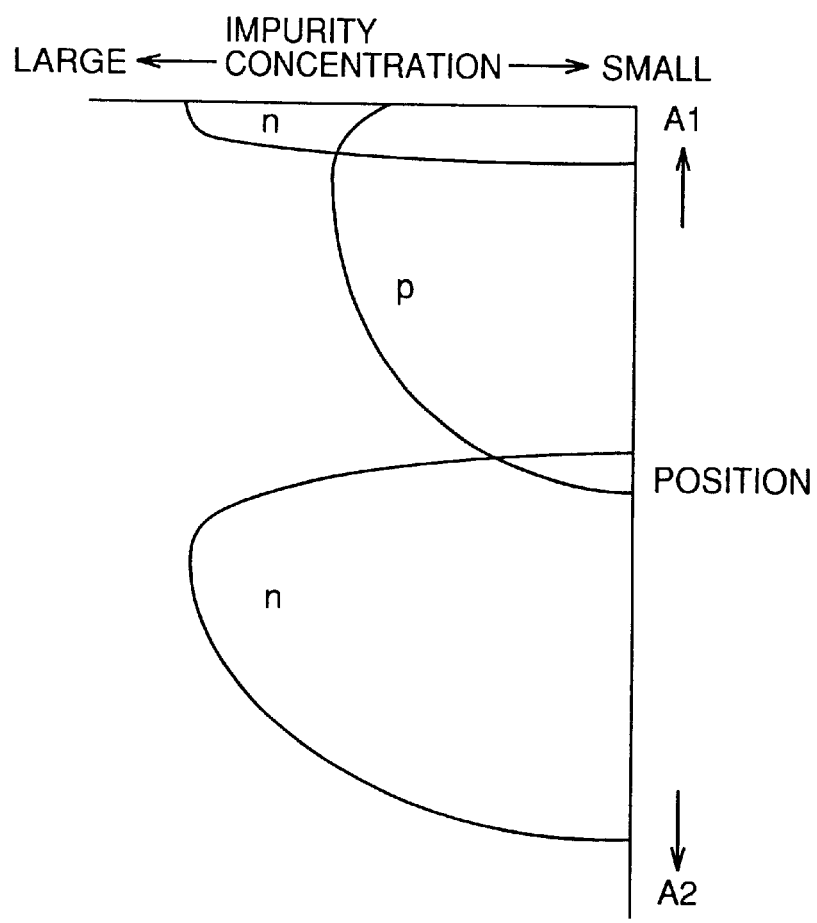
FIG. 3 illustrates the impurity concentration profile of a portion along the line A1–A2 in FIG. 1.
Figure 4:
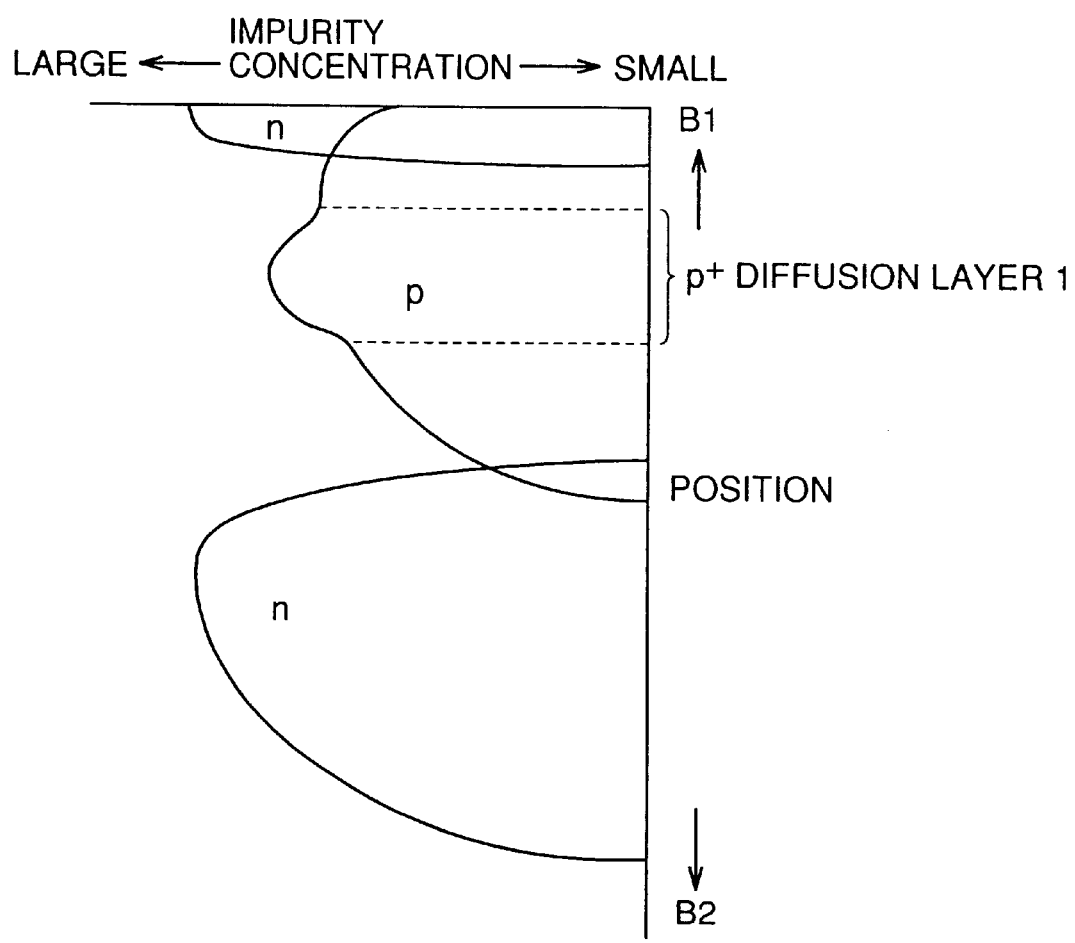
FIG. 4 illustrates the impurity concentration profile of a portion along the line B1–B2 in FIG. 1.

Referring to FIG. 3, the window part 1a of the $p^+$ diffusion layer 1 is located immediately under the emitter 4 in a portion along the line A1–A2 in FIG. 1, and hence the p-type impurity concentration of this portion is defined by only the impurity concentration of the $p^+$ diffusion layer 2a and loosely changes. Referring to FIG. 4, the $p^+$ diffusion layer 1 is located immediately under the emitter 4 in a portion along the line B1–B2 in FIG. 1, and hence the p-type impurity concentration abruptly rises at the portion of the $p^+$ diffusion layer 1. The boundary between the $p^+$ diffusion layers 1 and 2a is the part where the impurity concentration abruptly starts to change.

Figure 5:
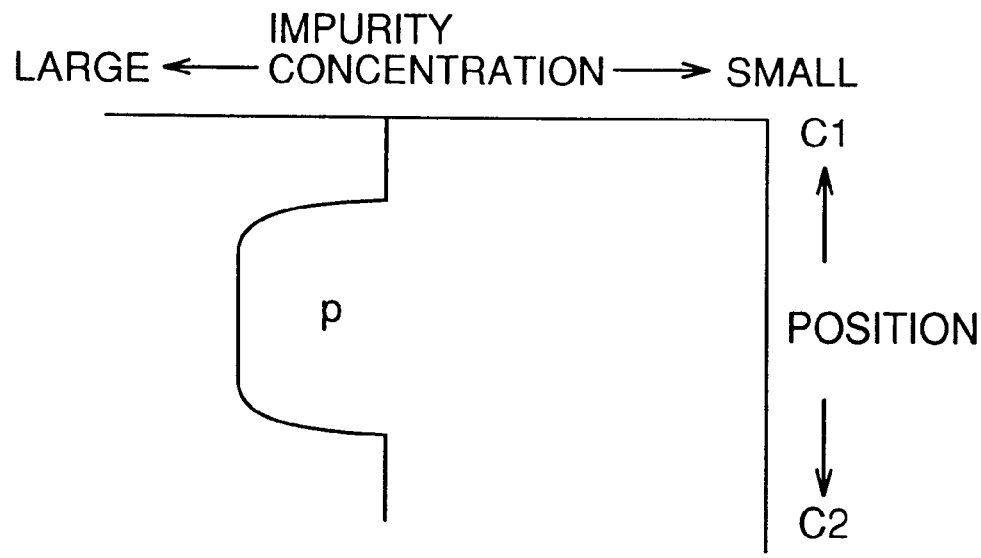
FIG. 5 illustrates the impurity concentration profile of a portion along the line C1–C2 in FIG. 1.
Figure 6:
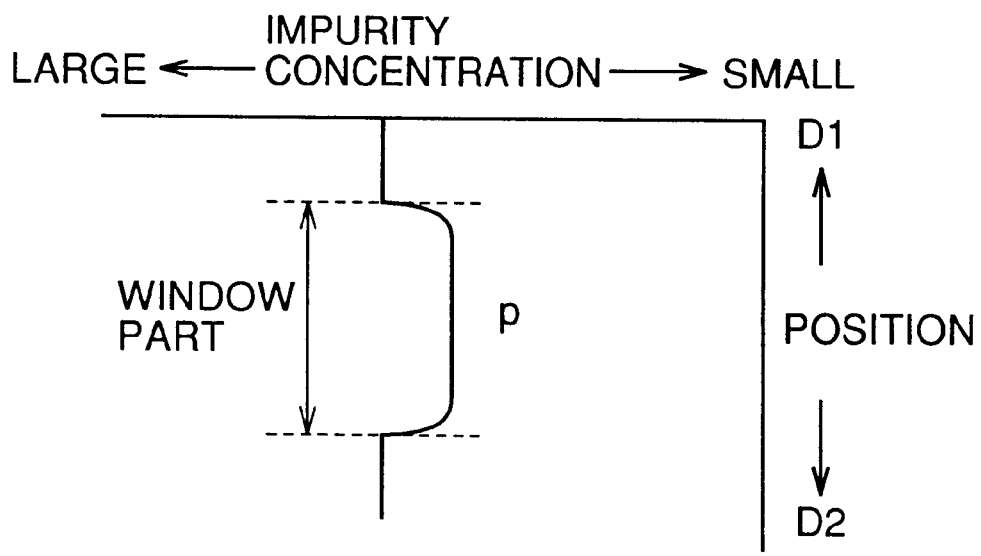
FIG. 6 illustrates the impurity concentration profile of a portion along the line D1–D2 in FIG. 1.

Referring to FIG. 5, the impurity concentration of the $p^+$ diffusion layer 2b is higher than that of the $p^+$ diffusion layer 2a. Referring to FIG. 6, no $p^+$ diffusion layer 1 is present on the window part 1a of the $p^+$ diffusion layer 1 and hence the impurity concentration of the window part 1a is defined by that of the $p^+$ diffusion layer 2a and lower than the impurity concentration of the $p^+$ diffusion layer 1. According to this embodiment, the window part 1a of the $p^+$ diffusion layer 1 is set with reference to a position where the impurity concentration starts to lower, as shown in FIG. 6.

A method of fabricating the semiconductor device according to this embodiment is now described.

Figure 7:
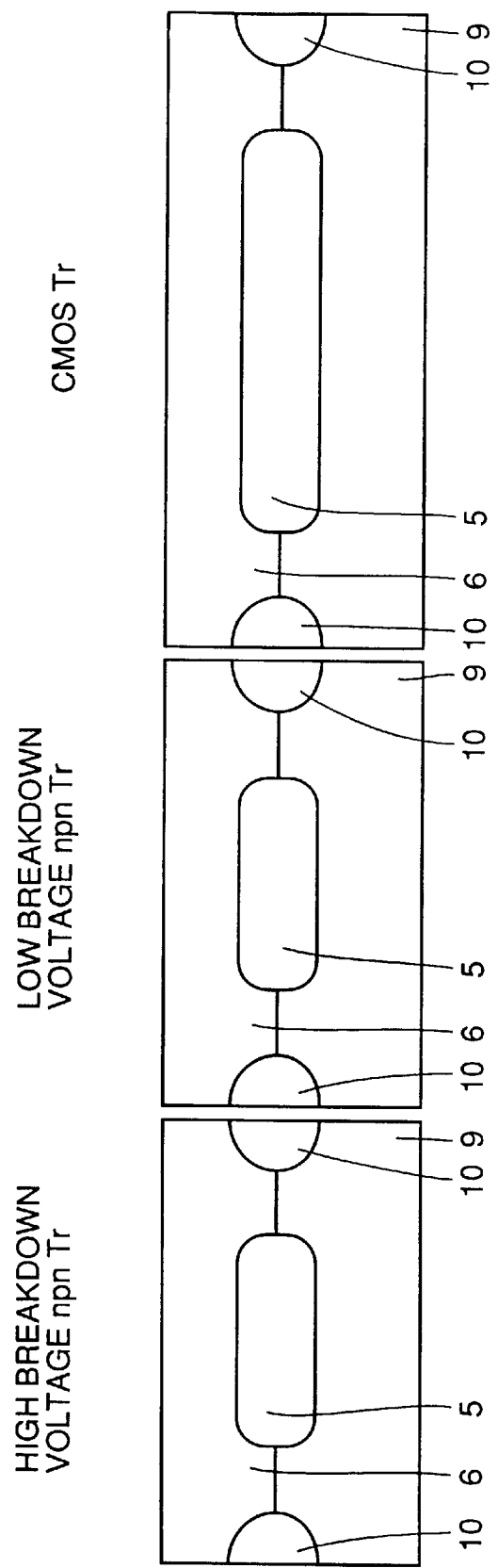
FIGS. 7 to 12 are schematic sectional views successively showing steps in a method of fabricating a semiconductor device according to the first embodiment of the present invention.

Referring to FIG. 7, the surface of the p-type silicon substrate 9 is oxidized thereby forming a silicon oxide film (not shown). The silicon oxide film is patterned by prescribed photolithography and working, for partially exposing the surface of the p-type silicon substrate 9. Antimony is injected into the exposed surface portions of the p-type silicon substrate 9 and thereafter heat treatment is performed at a temperature of about 1240° C., for forming the $n^+$ diffusion layers 5. Thereafter the silicon oxide film formed on the p-type silicon substrate 9 is removed.

Then, a silicon oxide film (not shown) of about several 10 nm in thickness is formed on the p-type silicon substrate 9 by CVD (chemical vapor deposition) or the like. The silicon oxide film is patterned by prescribed photolithography and working, for partially exposing the surface of the p-type silicon substrate 9. Boron is injected into the exposed surface portions of the p-type silicon substrate 9, and thereafter heat treatment is performed at a temperature of about 1100° C. for forming the p$^+$ diffusion layers 10. Thereafter the silicon oxide film formed on the p-type silicon substrate 9 is removed.

Then, the n$^-$ epitaxial layer 6 of silicon is formed on the p-type silicon substrate 9 by epitaxy. At this time, the epitaxy is performed at a temperature of about 1150° C., and hence the impurities contained in the n$^+$ diffusion layers 5 and the p$^+$ diffusion layers 10 are thermally diffused toward the n$^-$ epitaxial layer 6 with growth of the n$^-$ epitaxial layer 6.

Figure 8:
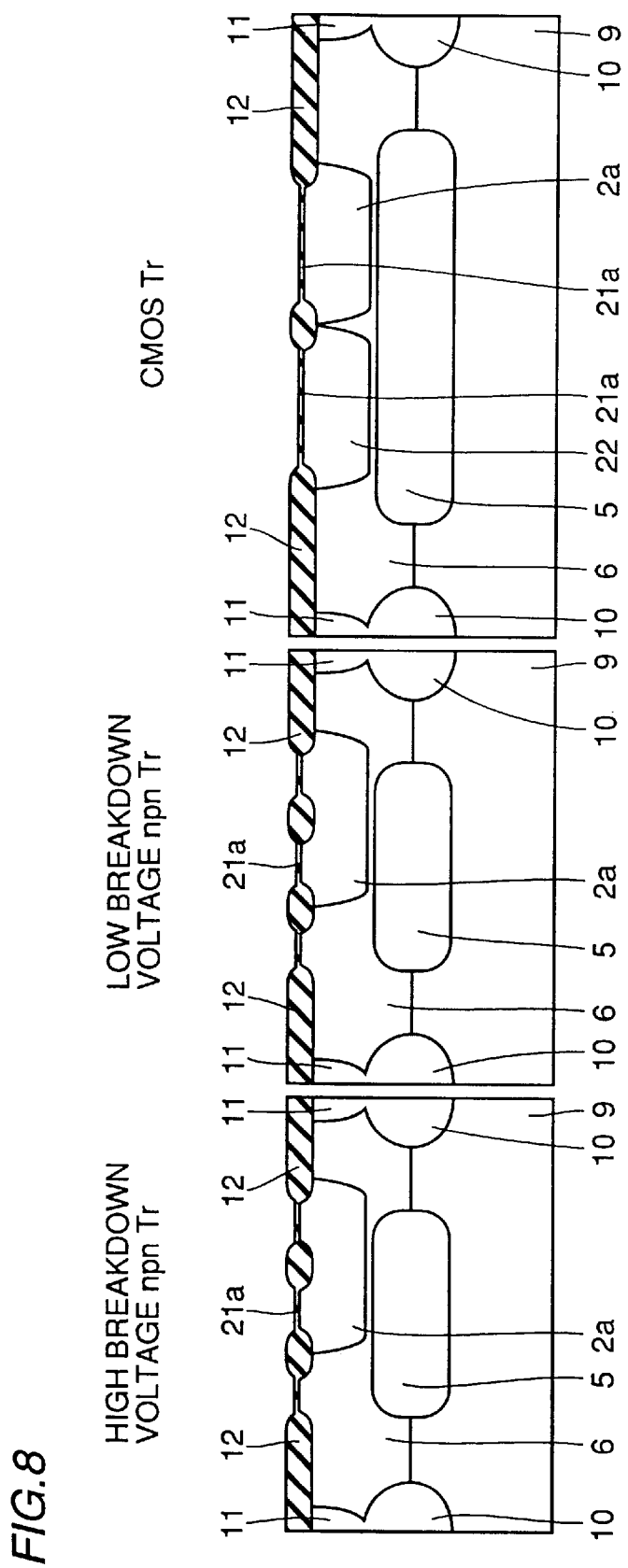

Referring to FIG. 8, a silicon oxide film (not shown) of about several 10 nm in thickness is formed on the n$^-$ epitaxial layer 6 by CVD or the like, and a silicon nitride film (not shown) is formed thereon by CVD or the like. The silicon nitride film is patterned by prescribed photolithography and working, for partially exposing the surface of the silicon oxide film.

Phosphorus is injected into the n$^-$ epitaxial layer 6 through the exposed surface portion of the silicon oxide film and thereafter thermal oxidation is performed at a temperature of about 950° C., for forming an n_ diffusion layer 22 on a CMOS transistor region. The silicon nitride film is removed for exposing the silicon oxide film located under the same.

Prescribed photolithography is performed on the exposed silicon oxide film for forming a photoresist pattern (not shown). The photoresist pattern is employed as a mask for injecting boron into prescribed regions of the n$^-$ epitaxial layer 6, and thereafter heat treatment is performed at a temperature of about 1180° C. for forming the p$^+$ diffusion layers 2a on the respective transistor regions and the p$^+$ diffusion layers 11 on isolation regions respectively. The photoresist pattern is removed by ashing, for example.

Then, the exposed silicon oxide film is removed for exposing the surfaces of the n$^-$ diffusion layer 22, the p$^+$ diffusion layers 2a and the n_ epitaxial layer 6. A silicon oxide film 21a of about several 10 nm in thickness is formed on the exposed surfaces, and a silicon nitride film (not shown) is formed thereon. The silicon nitride film is patterned by prescribed photolithography and working, and thereafter heat treatment is performed for forming the field oxide films 12 by the LOCOS method. Thereafter the silicon nitride film is removed.

Figure 9:
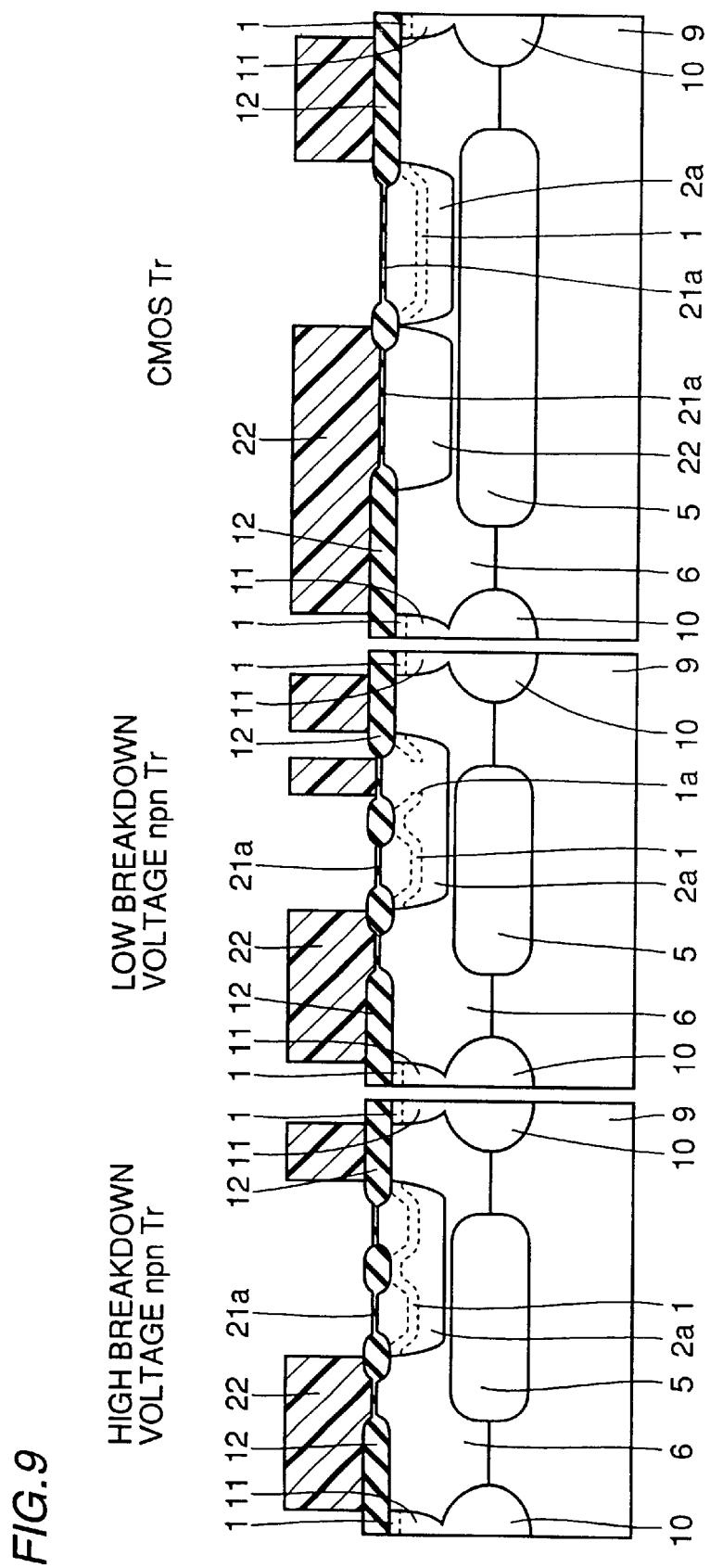

Referring to FIG. 9, a photoresist pattern 22 is formed by prescribed photolithography and thereafter employed as a mask for injecting boron, thereby forming the p$^+$ diffusion layers 1 in the p$^+$ diffusion layers 2a and 11 respectively. In particular, the p$^+$ diffusion layer 1 in the low breakdown voltage npn bipolar transistor region is formed to have the window part 1a. Thereafter the photoresist pattern 22 is removed by ashing, for example.

Then, the silicon oxide film 21a is removed for exposing the surfaces of the p$^+$ diffusion layers 2a, the n$^-$ diffusion layer 22 and the n$^-$ epitaxial layer 6. At the same time, the surfaces of the field oxide films 12 are also removed by a thickness of about several 10 nm.

Figure 10:
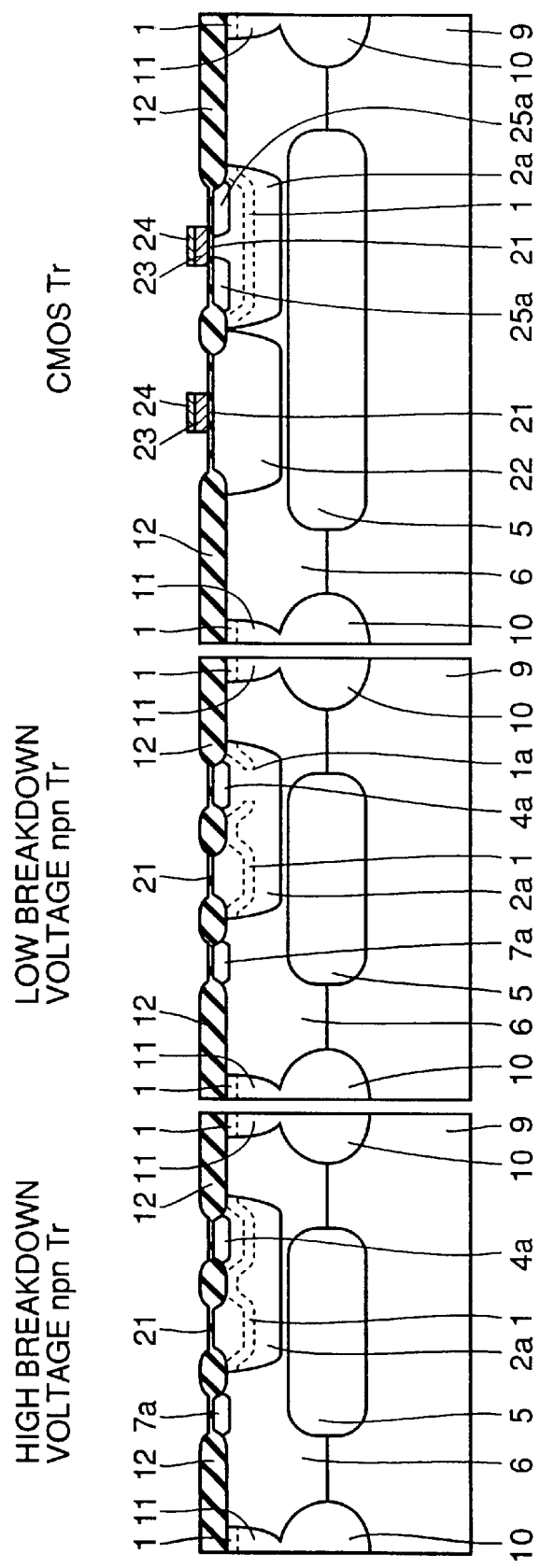

Referring to FIG. 10, thermal oxidation is performed for forming silicon oxide films 21 of about 10 to 50 nm in thickness on the exposed silicon surface portions. A doped polysilicon film 23 is formed by CVD or the like to cover the overall surface, and a tungsten silicide film 24 is formed thereon by sputtering or the like. The tungsten silicide film 24 and the doped polysilicon film 23 are patterned by prescribed photolithography and working, for forming gate electrodes 23 and 24.

Then, a photoresist pattern (not shown) is formed on prescribed regions by prescribed photolithography and thereafter employed as a mask for injecting phosphorus by oblique ion rotational injection (angle of injection: about 45°). Thus, the n$^-$ diffusion layers 4a, 7a and 25a are formed. Thereafter the photoresist pattern is removed by ashing, for example.

Figure 11:
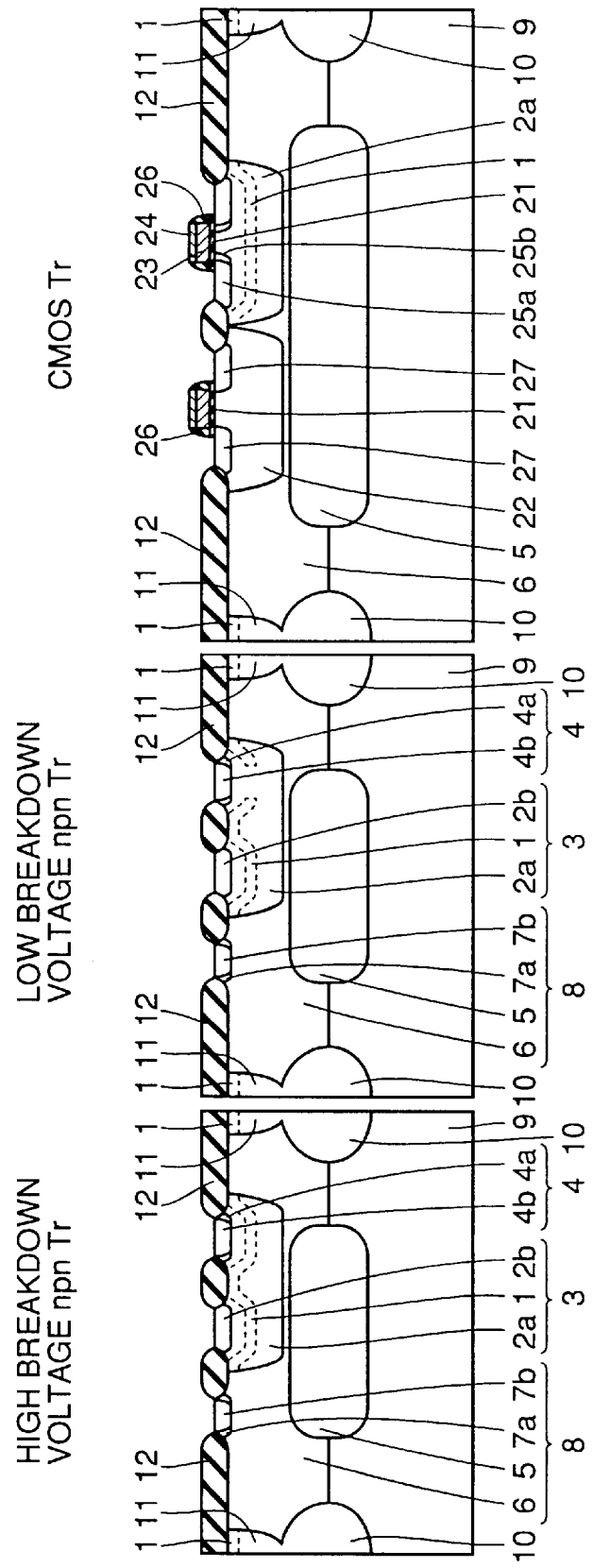

Referring to FIG. 11, a silicon oxide film 26 is formed by CVD or the like to cover the overall surface, and the overall surface thereof is anisotropically etched for forming side wall insulating layers 26 covering the side surfaces of the gate electrodes 23 and 24. In this anisotropic etching, the silicon oxide films 21 are removed in the regions formed with no field oxide films 12, for exposing the silicon surface portions. In this state, the field oxide film 12 is formed on the surface of the p$^+$ diffusion layer 2a of the low breakdown voltage npn bipolar transistor in this embodiment.

Then, a photoresist pattern (not shown) is formed on prescribed regions and employed as a mask for injecting arsenic. The photoresist pattern is removed by ashing, for example, and thereafter heat treatment is performed in a nitrogen atmosphere at a temperature of about 900° C., thereby driving arsenic injected in the aforementioned manner and forming the n$^+$ diffusion layers 4b, 7b and 25b.

Then, a photoresist pattern (not shown) is formed on prescribed regions and employed as a mask for injecting boron difluoride (BF$_2$). Thus, the p$^+$ diffusion layers 2b and 27 are formed. Thereafter the photoresist pattern is removed by ashing.

Thus formed are the low and high breakdown voltage npn bipolar transistors having the collectors 8, the bases 3 and the emitters 4 and the CMOS transistor.

Figure 12:
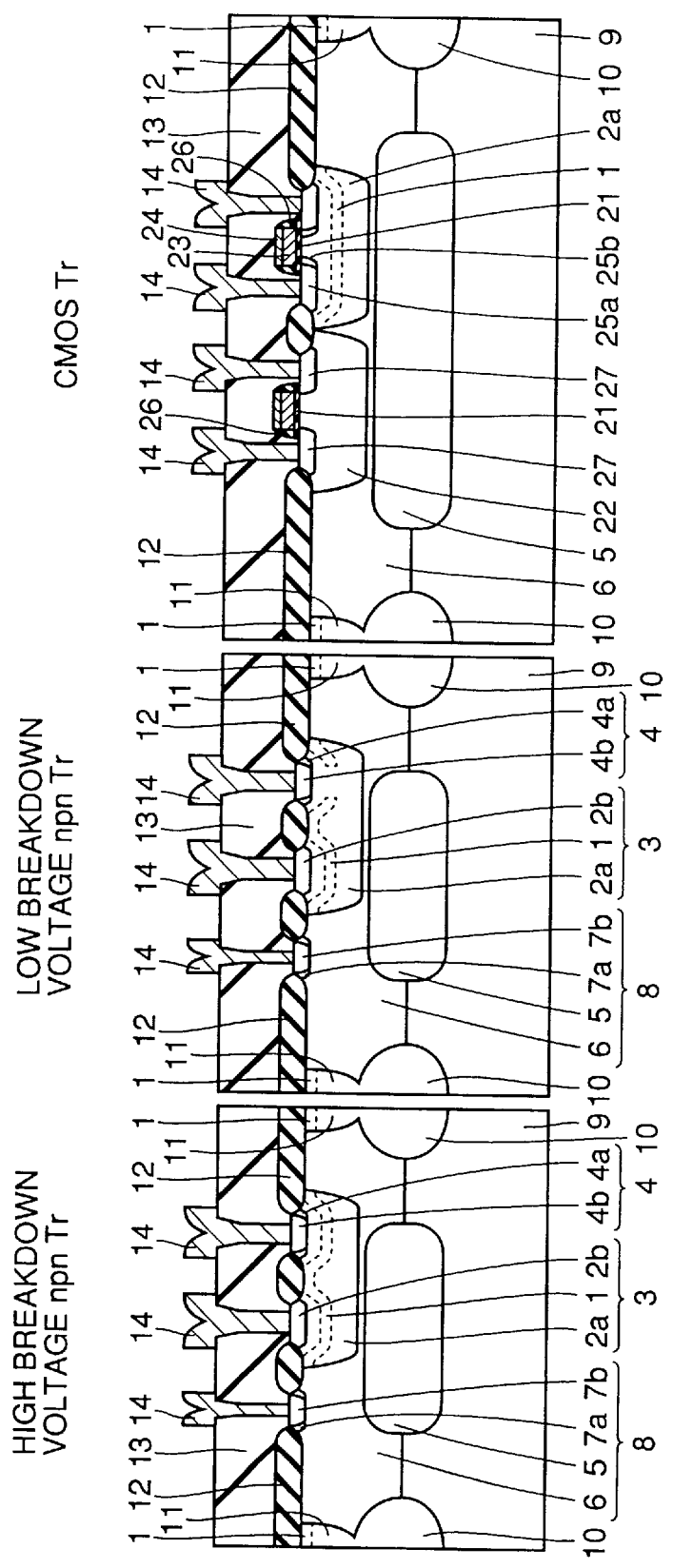

Referring to FIG. 12, the interlayer isolation layer 13 of a silicon oxide film or the like is formed on the overall surface by CVD or the like to cover the respective transistors. The interlayer isolation layer 13 is patterned by prescribed photolithography and working for forming contact holes therein. Thereafter an aluminum layer, for example, is deposited on the overall surface by sputtering and thereafter patterned by prescribed photolithography and working, for forming the electrodes 14 in contact with the respective diffusion layers through the contact holes.

According to this embodiment, the field oxide film 12 is located on the surface region held between the p$^+$ diffusion layer 2b and the emitter 4 of the low breakdown voltage npn bipolar transistor, as shown in FIG. 1. Thus, the p$^+$ diffusion layers 2a and 2b are not exposed in the region held between the p$^+$ diffusion layer 2b and the emitter 4. In the heat treatment step shown in FIG. 11 carried out under the nitrogen atmosphere for forming the n$^+$ diffusion layers 4b, 7b and 25b, therefore, boron is prevented from evaporating from the region of the p$^+$ diffusion layer 2a held between the p$^+$ diffusion layer 2b and the emitter 4. Therefore, it is possible to suppress increase of dispersion of the current amplification factor h$_{FE}$ in the wafer plane caused by evaporation of boron.

Figure 25:
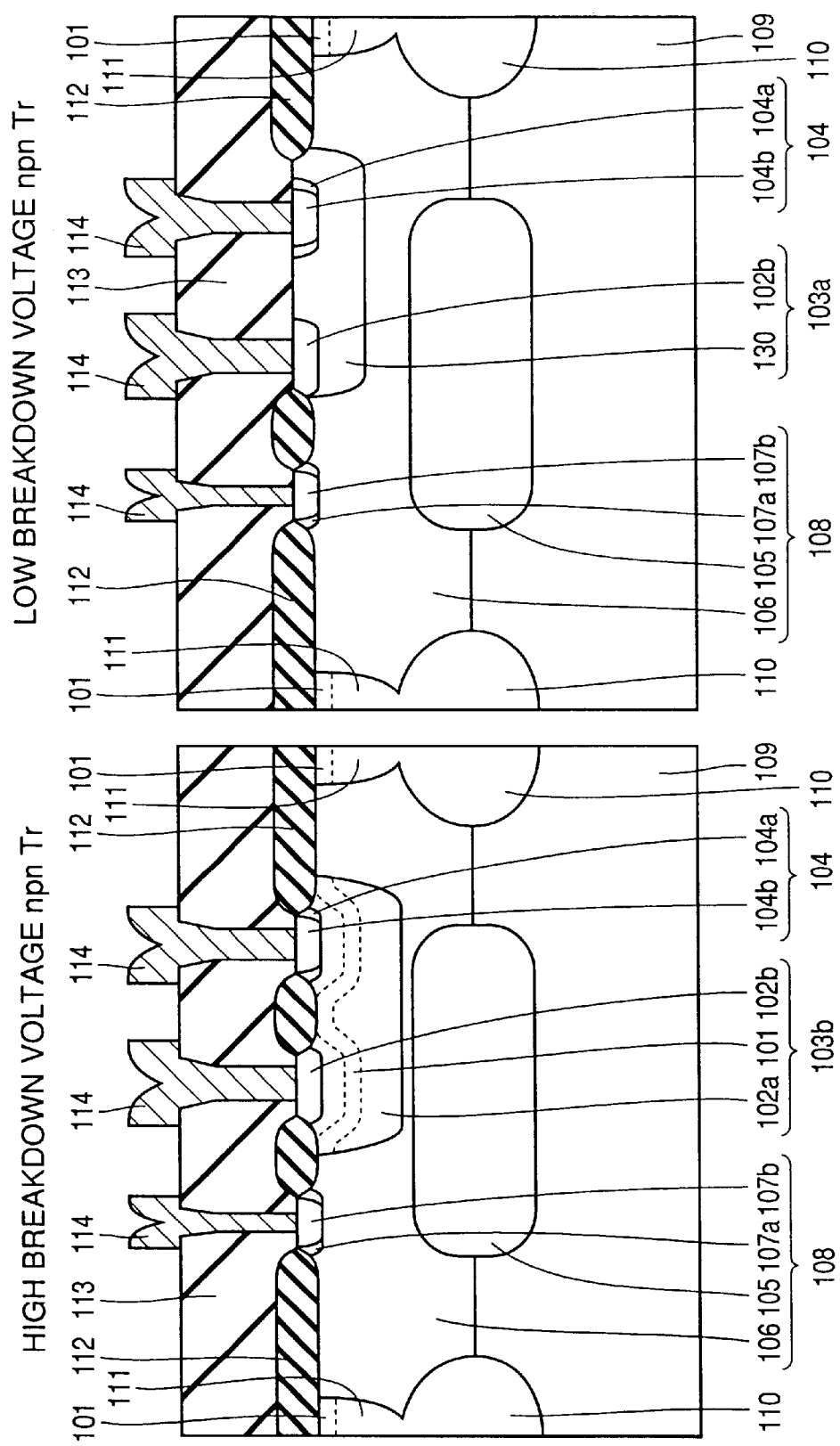
FIG. 25 is a sectional view schematically showing the structure of a conventional semiconductor device.
Figure 26:
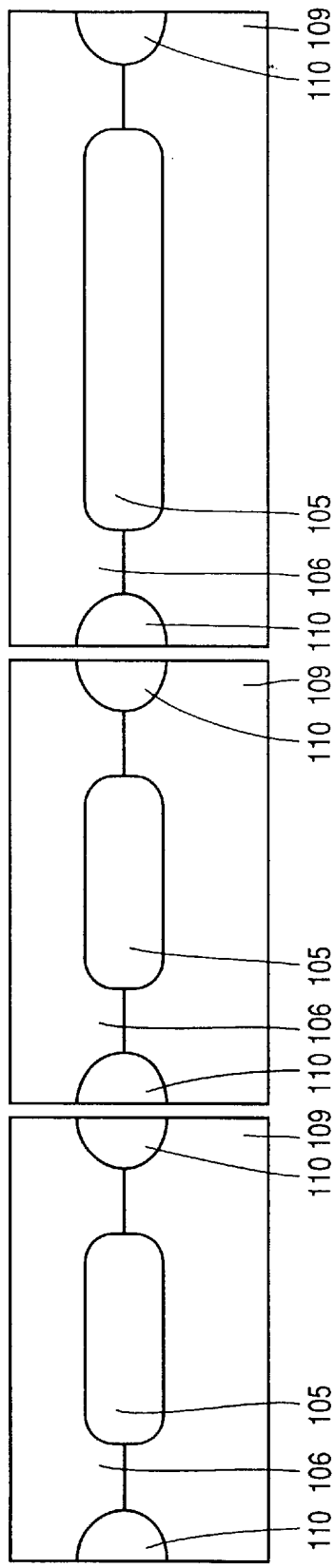
FIGS. 26 to 30 are schematic sectional views successively showing steps in a conventional method of fabricating a semiconductor device.
Figure 27:
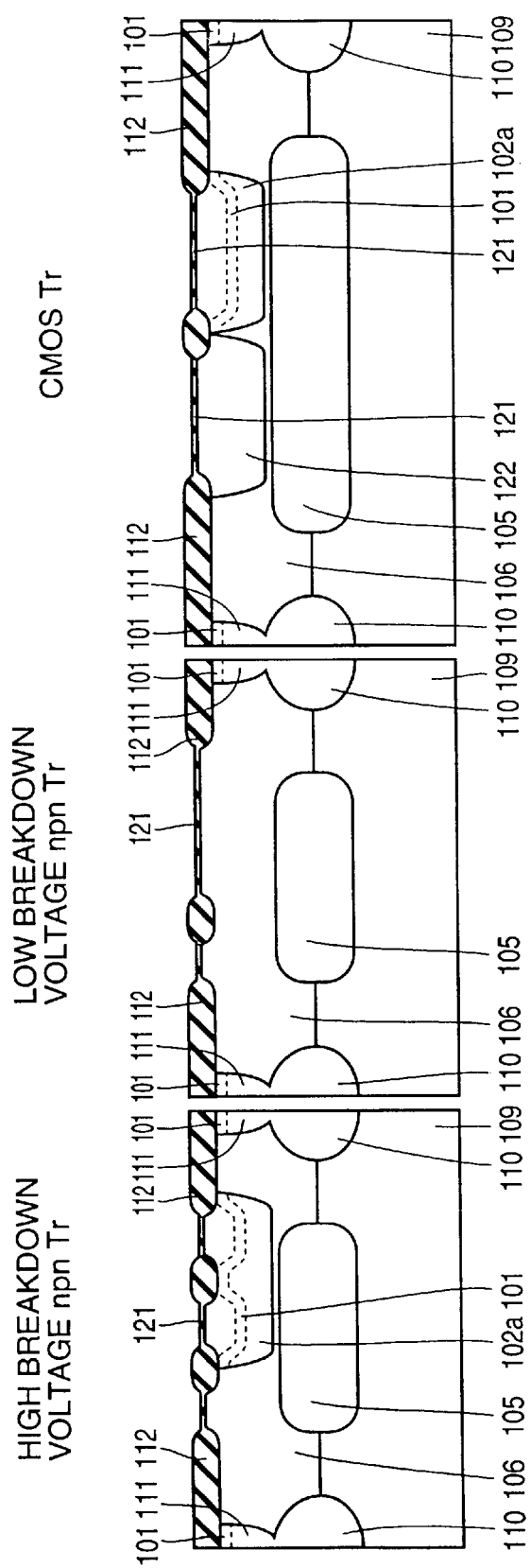
Figure 28:
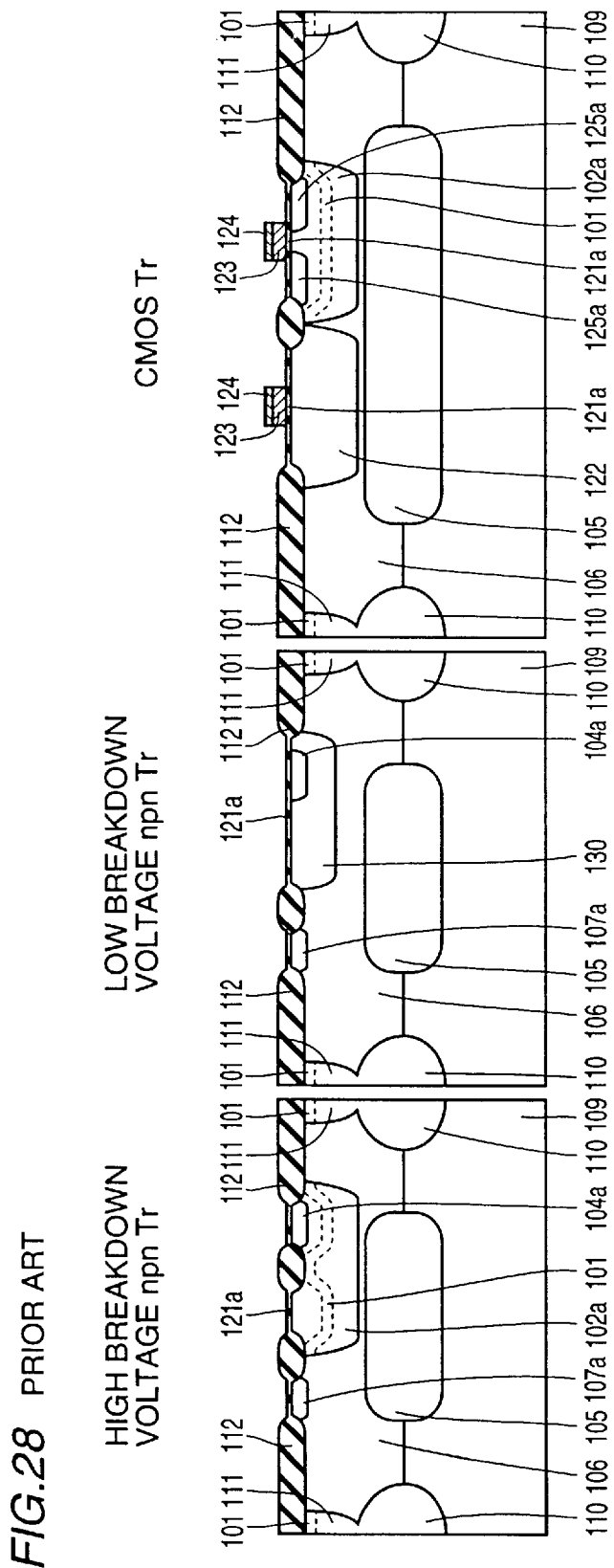
Figure 29:
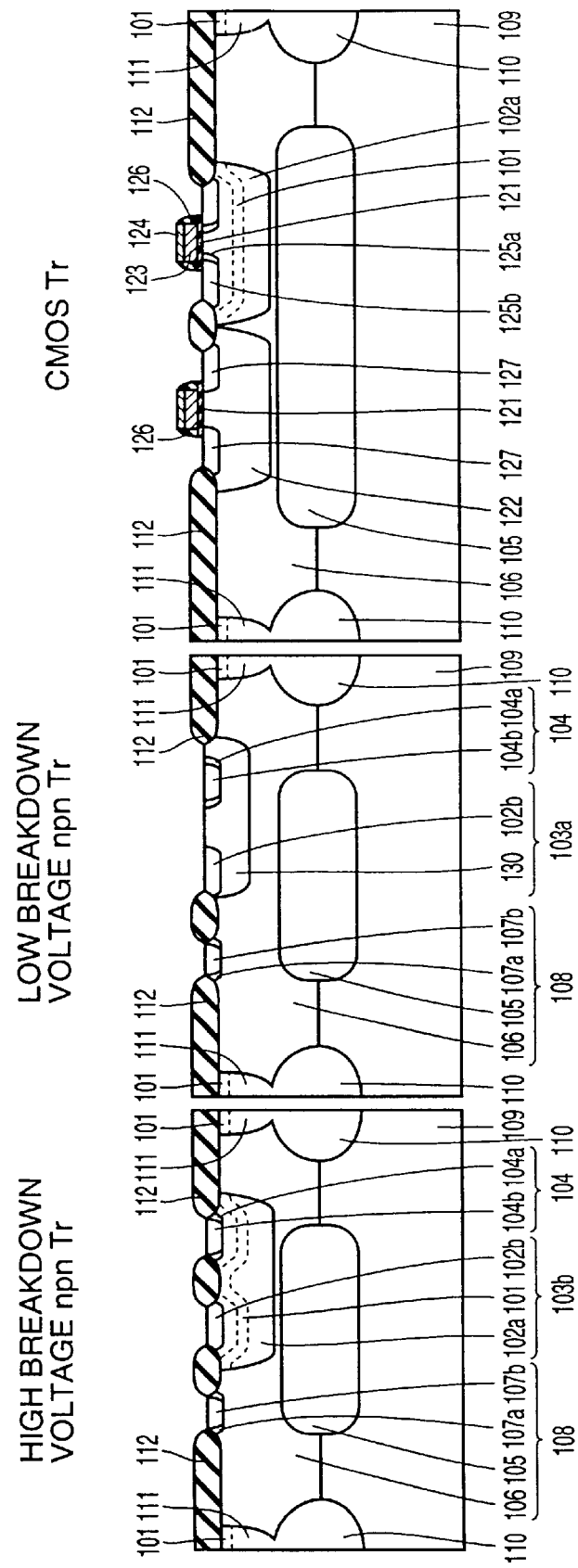
Figure 30:
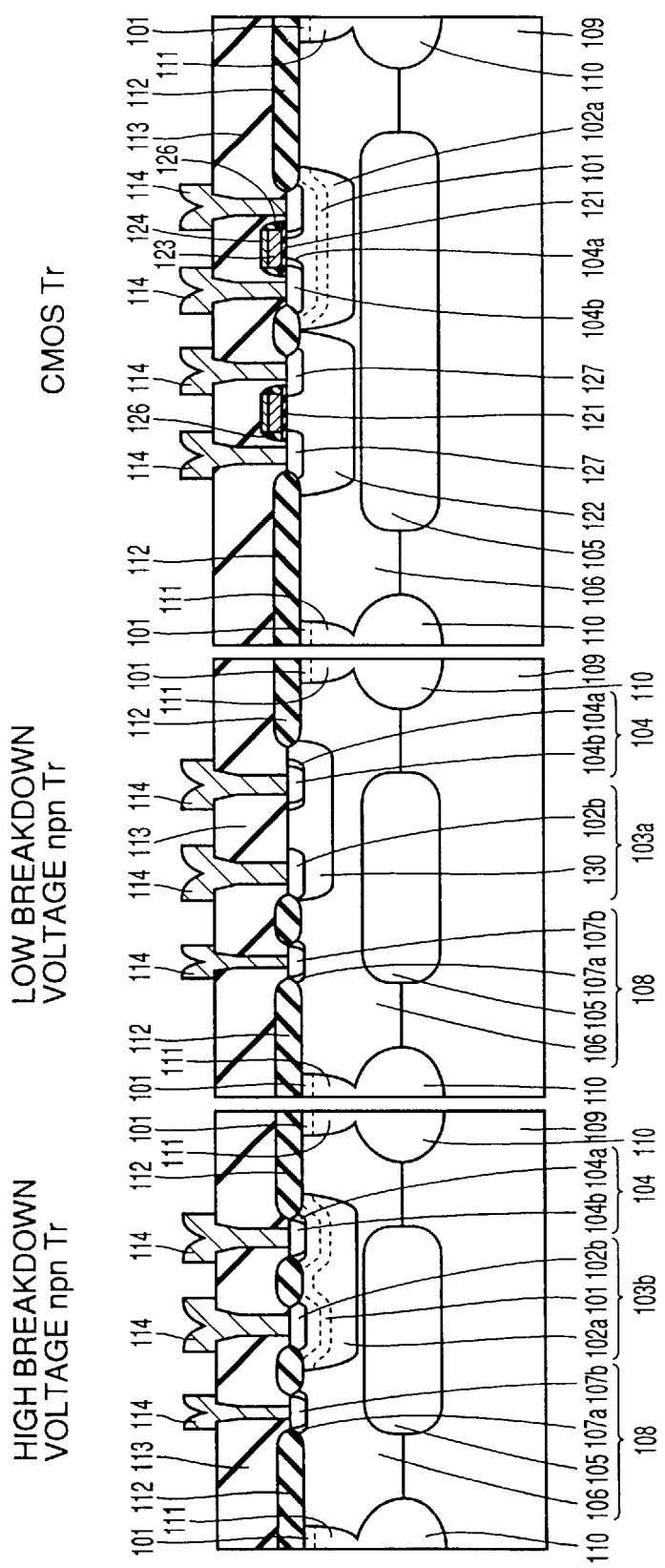
Figure 31A:
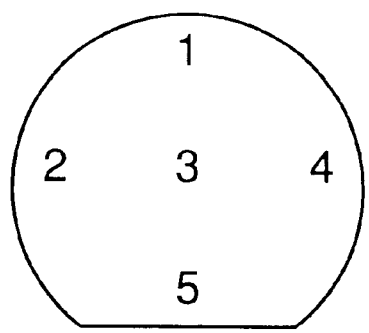
FIGS. 31A to 31F are diagrams for illustrating dispersion of a current amplification factor $h_{FE}$ in a wafer plane in the conventional semiconductor device.
Figure 31B:
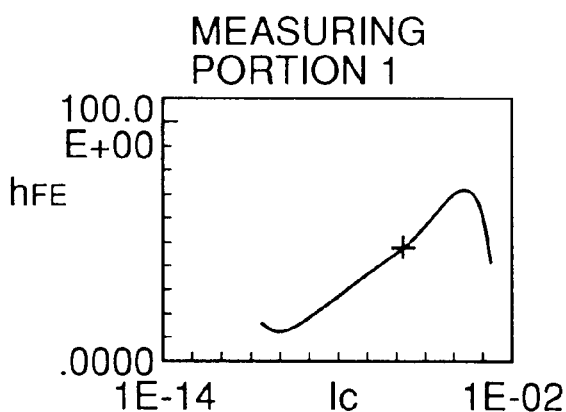
Figure 31C:
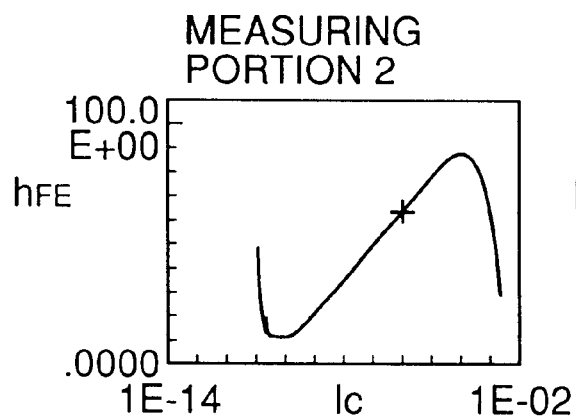
Figure 31D:
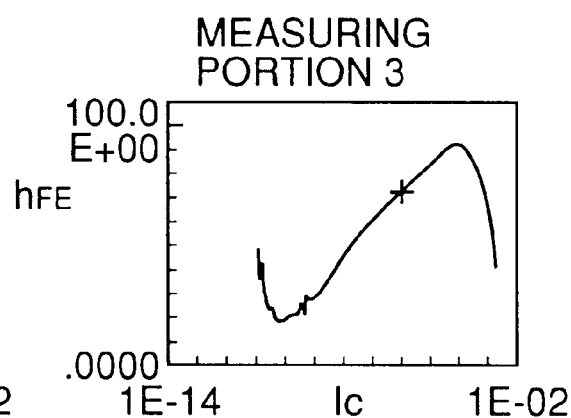
Figure 31E:
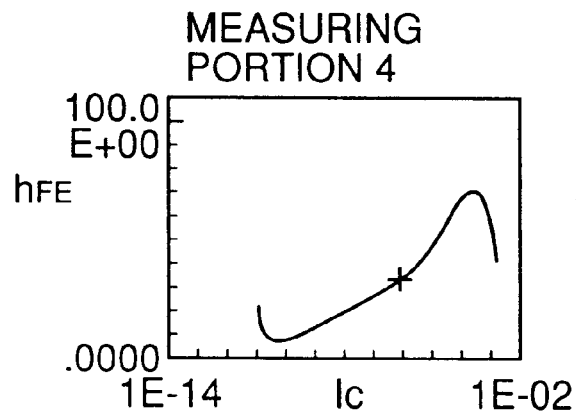
Figure 31F:
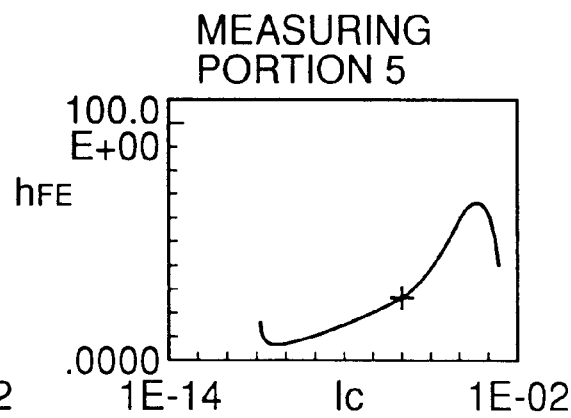
Figure 32:
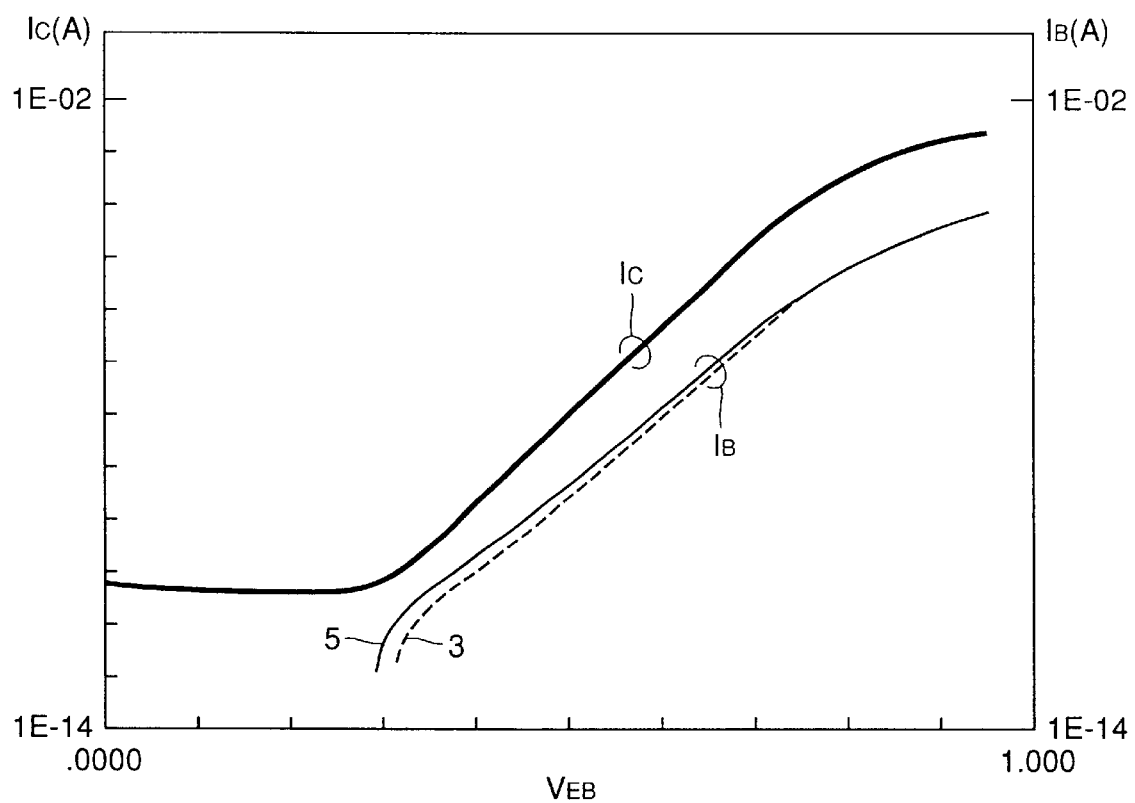
FIG. 32 is a diagram for illustrating dispersion of a base current $I_B$ of a low breakdown voltage npn bipolar transistor of the conventional semiconductor device.
Figure 33:
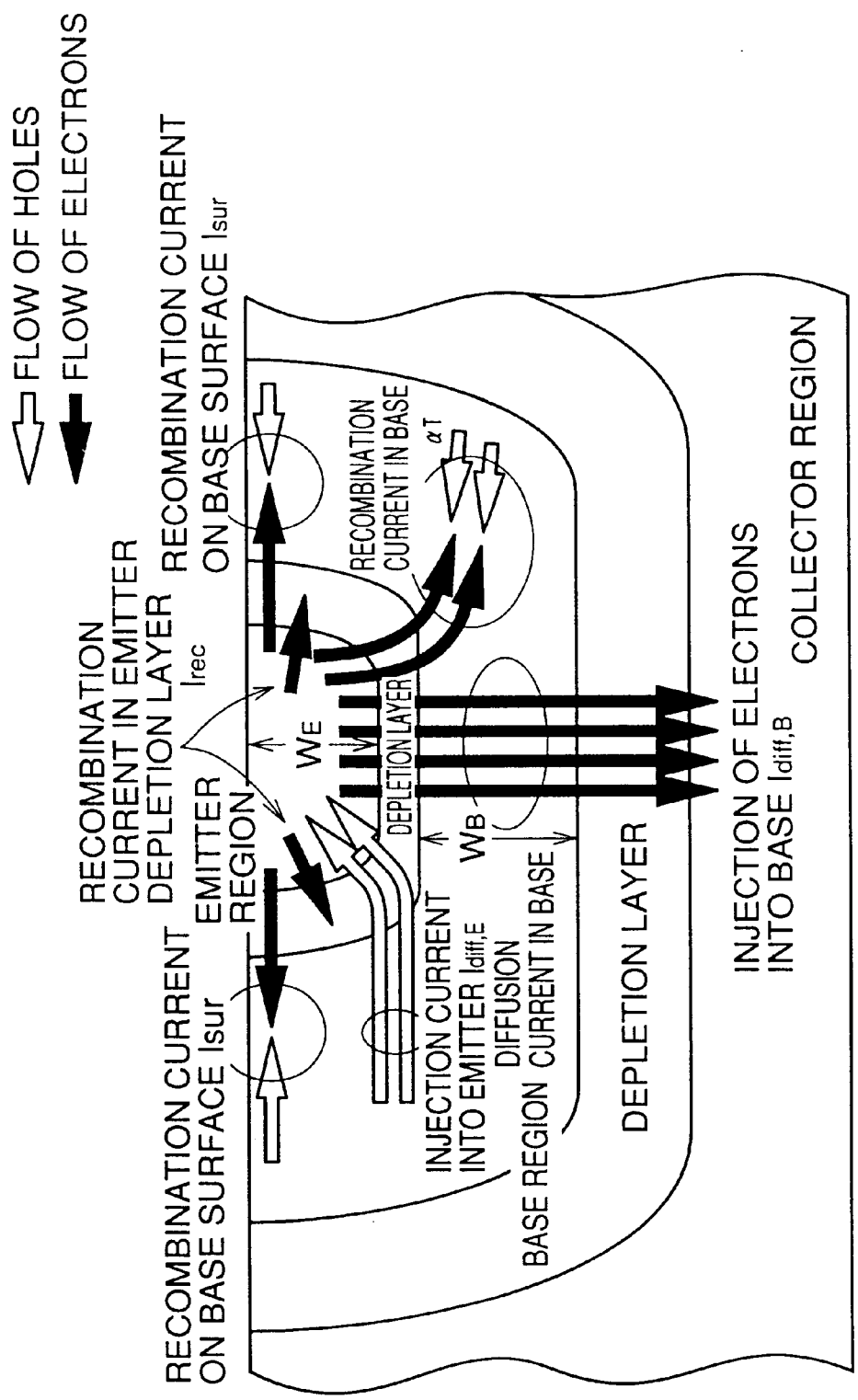
FIG. 33 is a diagram for illustrating respective components of the base current $I_B$ in the bipolar transistor.

In the prior art shown in FIG. 25, the p-type diffusion layer 130 of the low breakdown voltage npn bipolar transistor is formed in the step shown in FIG. 28 after the step of forming the field oxide films 112 shown in FIG. 27. Therefore, no field oxide film 112 can be formed on the surface of the p-type diffusion layer 130. According to this embodiment, the p$^+$ diffusion layer 2a of the low breakdown voltage npn bipolar transistor is formed before formation of the field oxide films 12, as shown in FIG. 8. Therefore, the field oxide film 12 can be formed on the surface of the p$^+$ diffusion layer 2a.

According to this embodiment, the p$^+$ diffusion layer 2a of the low breakdown voltage npn bipolar transistor is substantially identical in diffusion depth to the p$^+$ diffusion layer 2a of the high breakdown voltage npn bipolar transistor. Therefore, the p$^+$ diffusion layers 2a of the low and high breakdown voltage npn bipolar transistors can be formed in the same step shown in FIG. 8. Thus, the fabrication steps can be simplified.

In order to form the p$^+$ diffusion layer 2a of the low breakdown voltage npn bipolar transistor in the same step as that for the p$^+$ diffusion layer 2a of the high breakdown voltage npn bipolar transistor, however, the p$^+$ diffusion layers 2a must be formed before the LOCOS step. In this case, the impurity contained in the p$^+$ diffusion layer 2a of the low breakdown voltage npn bipolar transistor remarkably diffuses due to the heat treatment at a high temperature for a long time in the LOCOS method. Thus, the impurity concentration on the surface of the p$^+$ diffusion layer 2a so lowers that no transverse emitter-to-collector breakdown voltage can be ensured on this surface.

According to this embodiment, therefore, the p$^+$ diffusion layer 1 encloses the periphery of the emitter 4 on the surface of the substrate 1. The p$^+$ diffusion layer 1 has a higher impurity concentration than the p$^+$ diffusion layer 2a, and hence the transverse emitter-to-collector breakdown voltage can be ensured by enclosing the periphery of the emitter 4 with the p$^+$ diffusion layer 1.

When enclosing the overall lower portion of the emitter 4 with the p$^+$ diffusion layer 1, however, the breakdown voltage excessively increases similarly to the high breakdown voltage npn bipolar transistor and it is difficult for the low breakdown voltage npn bipolar transistor to operate at a low breakdown voltage. According to this embodiment, therefore, the window part 1a is provided on the region of the p$^+$ diffusion layer 1 located immediately under the emitter 4. The window part 1a is provided for lowering the p-type impurity concentration in the region located immediately under the emitter 4, thereby enabling the low breakdown voltage npn bipolar transistor to operate at a low breakdown voltage.

The p$^+$ diffusion layer 1 of the low breakdown voltage npn bipolar transistor can be formed in the same step as that for the p$^+$ diffusion layer 1 of the high breakdown voltage npn bipolar transistor. Therefore, no additional fabrication step is required for forming the p$^+$ diffusion layer 1 of the low breakdown voltage npn bipolar transistor.

Thus, according to this embodiment, increase of dispersion of the current amplification factor $h_{FE}$ can be suppressed, the fabrication steps can be simplified, and operation at a low breakdown voltage is enabled.

The inventors have investigated in-wafer-plane distributions of the current amplification factors $h_{FE}$ ($I_C$=50 µA) of the low withstand npn bipolar transistors in the conventional structure (FIG. 25) and the structure (FIG. 1) according to this embodiment. Tables 1 and 2 show the results in the conventional structure and the structure according to this embodiment respectively.

TABLE 1

$h_{FE}$ (Current Amplification Factor)
1c = 50 µA

| | $h_{FE}$ |
|---|---|
| Measuring Portion 1 | 66.0 |
| Measuring Portion 2 | 88.4 |
| Measuring Portion 3 | 91.7 |
| Measuring Portion 4 | 60.2 |
| Measuring Portion 5 | 51.7 |

TABLE 2

$h_{FE}$ (Current Amplification Factor)
1c = 50 µA

| | $h_{FE}$ |
|---|---|
| Measuring Portion 1 | 216 |
| Measuring Portion 2 | 234 |
| Measuring Portion 3 | 212 |
| Measuring Portion 4 | 236 |
| Measuring Portion 5 | 247 |

It is understood from the results shown in Tables 1 and 2 that dispersion of the current amplification factor $h_{FE}$ characteristic in the wafer plane is smaller in the structure according to this embodiment as compared with the conventional structure.

In the structure according to this embodiment, a bipolar transistor having a necessary current amplification factor $h_{FE}$ can be readily obtained by changing the opening area of the window part 1a of the p$^+$ diffusion layer 1 of the low breakdown voltage npn bipolar transistor. This is now described.

Figure 13:
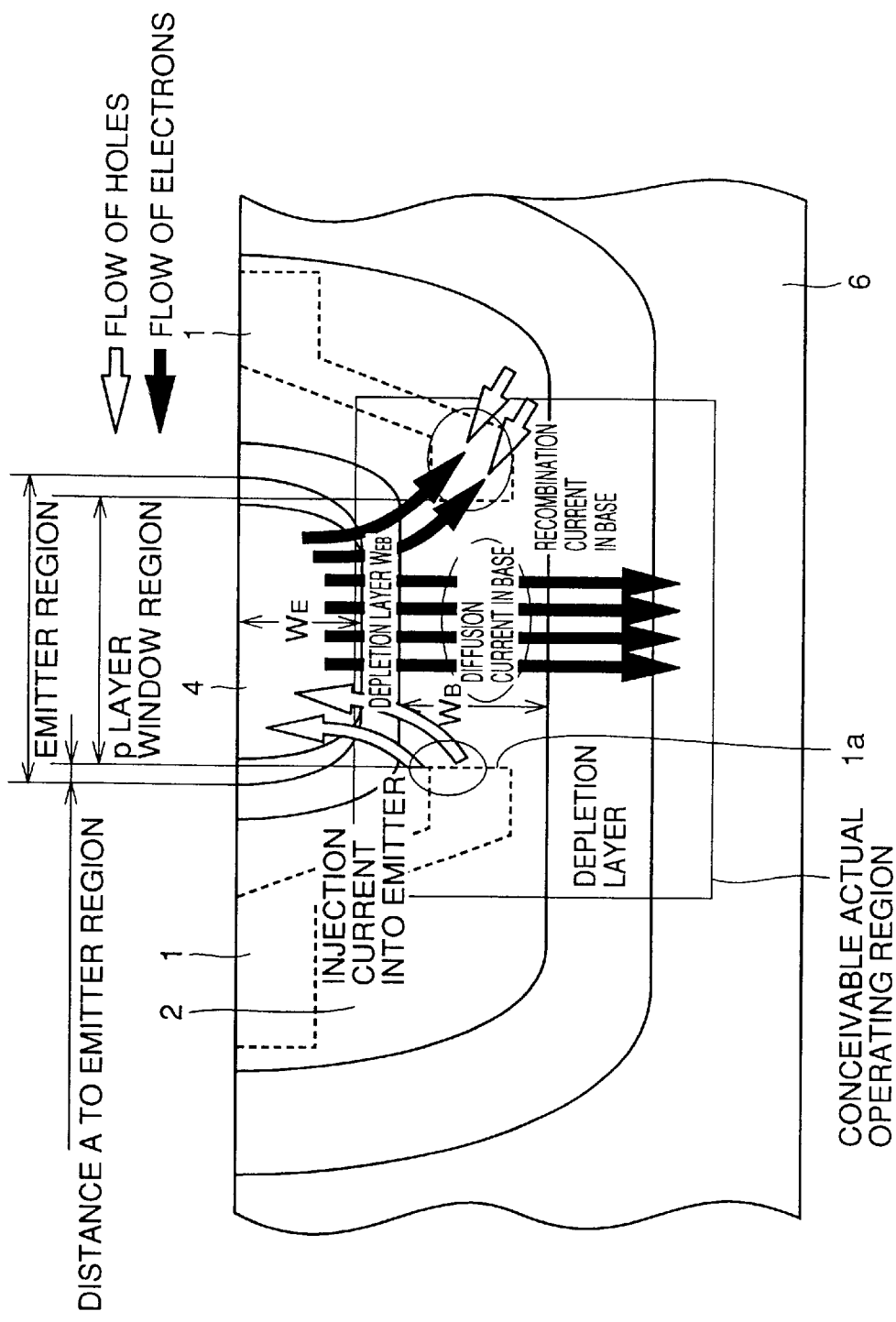
FIG. 13 is a diagram for illustrating a conceivable actual operating region of the low breakdown voltage npn bipolar transistor of the semiconductor device according to the first embodiment of the present invention.
Figure 14:
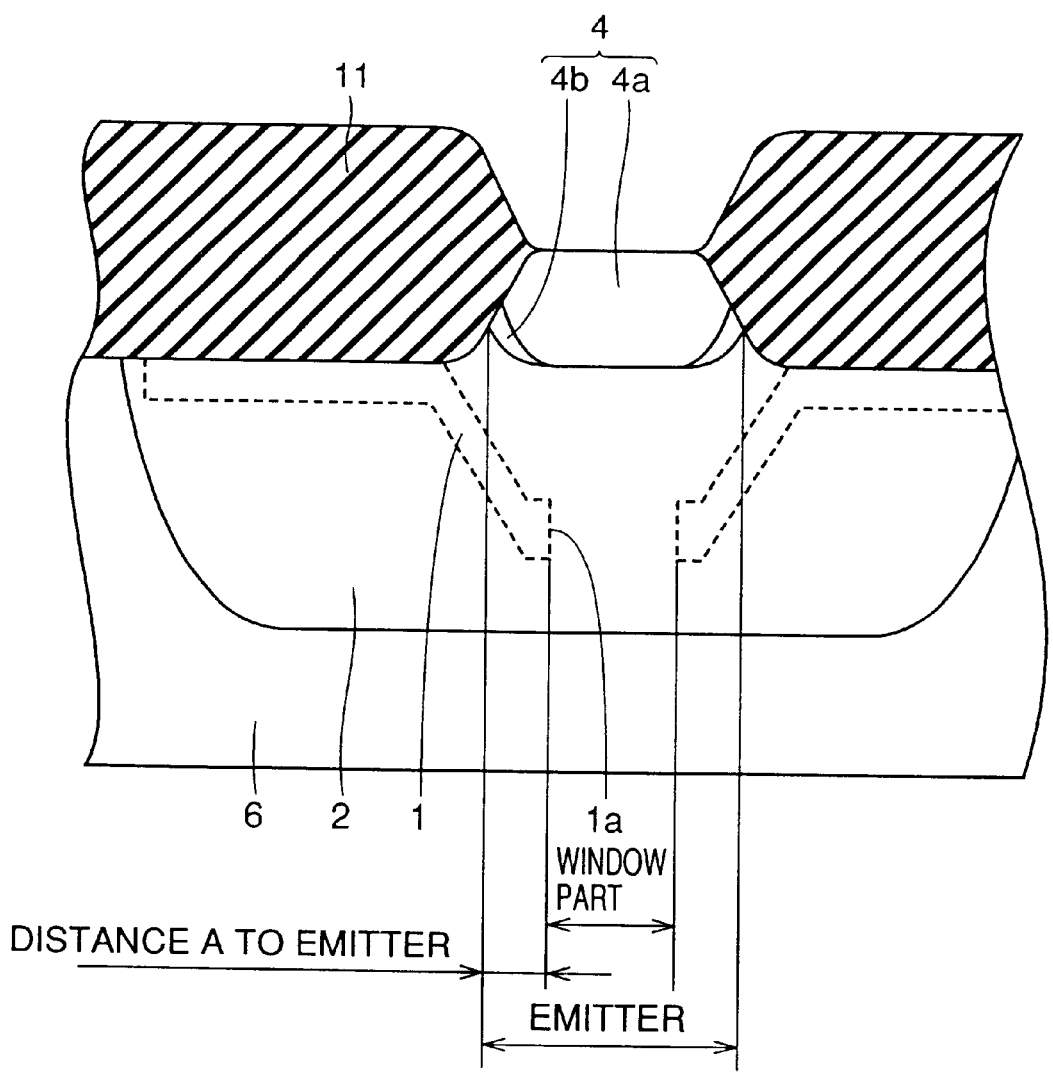
FIG. 14 is a diagram for illustrating a distance A to an emitter in the semiconductor device according to the first embodiment of the present invention.

FIG. 13 shows a conceivable actual operating region of the low breakdown voltage npn bipolar transistor in the structure of this embodiment. Referring to FIG. 13, the actual operating region is considered as deeper than the base surface. In an actual bipolar transistor, therefore, the recombination component $I_{sur}$ (component 5) on the base surface can be ignored, and the current amplification factor $h_{FE}$ is expressed as follows in this case:

$$\frac{1}{h_{FE}} \approx \frac{1}{2}\frac{W_B^2}{L_{nB}} + \frac{N_{AB}W_B}{D_{nB}} \cdot \frac{D_{PE}}{N_{DE}W_E} + \frac{N_{AB}W_B}{D_{nB}} \cdot \frac{W_{EB}/\tau_0}{2n_i\exp(qV_{EB}/kT)} \quad (5)$$

where $D_{nB}$ represents the electron diffusion constant in the base.

It is understood from the above expression (5) that the current amplification factor $h_{FE}$ depends on the ratio between the impurity concentrations $N_{AB}$ and $N_{DE}$ of the base and the emitter. The impurity concentration $N_{AB}$ of the base is the mean value of the impurity concentrations of the p$^+$ diffusion layers 2a and 1. The impurity concentration $N_{AB}$ of the base can be controlled by changing the opening area of the window part 1a of the p$^+$ diffusion layer 1, and hence the current amplification factor $h_{FE}$ can be controlled from the expression (5).

The inventors have investigated changes of the current amplification factor $h_{FE}$ with reference to the distance (distance to emitter) A to an end portion of the emitter 4 and the window part 1a set to 0 µm and 0.5 µm respectively. Table 3 shows the results.

TABLE 3

| | $h_{FE}$ (Current Amplification Factor) $1c = 50\,\mu A$ | |
|---|---|---|
| | Distance A to Emitter | |
| | 0 μm | 0.5 μm |
| Measuring Portion | 212 ($h_{FE}$) | 96 ($h_{FE}$) |

It has been recognizable from these results that the current amplification factor $h_{FE}$ of the low breakdown voltage npn bipolar transistor can be controlled by changing the opening area of the window part 1a.

(Second Embodiment)

Figure 15:
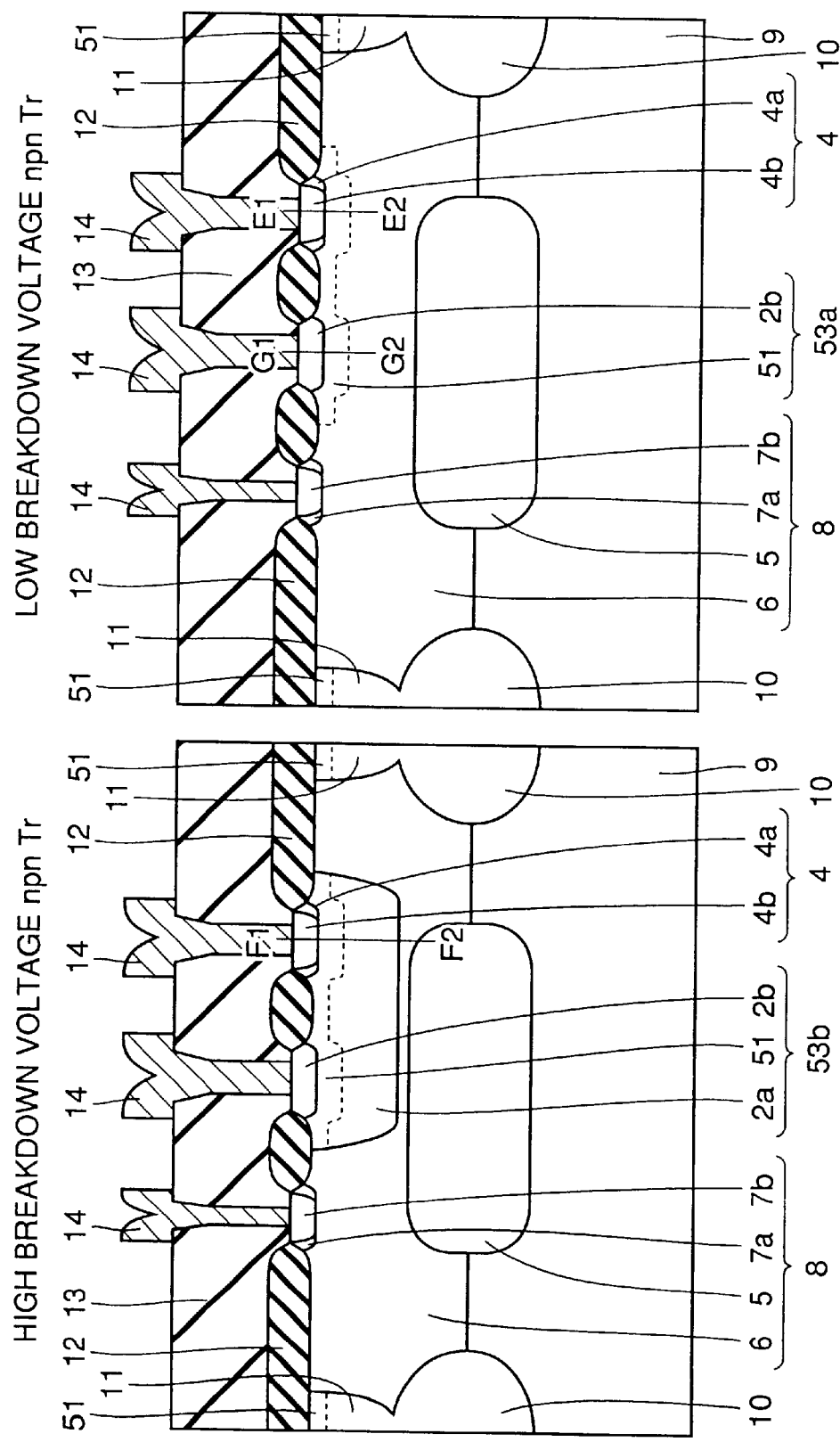
FIG. 15 is a sectional view schematically showing the structure of a semiconductor device according to a second embodiment of the present invention.

Referring to FIG. 15, a low breakdown voltage npn bipolar transistor of a semiconductor device according to a second embodiment of the present invention is different from the structure (FIG. 1) according to the first embodiment in the structure of a base 53a. This base 53a consists of only p+ diffusion layers 51 and 2b, with no layer corresponding to the p+ diffusion layer 2a of the structure (FIG. 1) according to the first embodiment. The p+ diffusion layer 51 is in contact with the lower surface of the p+ diffusion layer 2b, and has no window part. Therefore, the p+ diffusion layer 51 encloses the overall lower portion of an emitter 4. The junction between the p+ diffusion layer 51 and an n− epitaxial layer 6 has an irregular part reflecting an irregular shape formed by the upper surface of a field oxide film 12, the surface of the p+ diffusion layer 2b and the surface of the emitter 4.

A high breakdown voltage npn bipolar transistor of the semiconductor device according to this embodiment is different from the structure (FIG. 1) according to the first embodiment in the structure of a base 53b. This base 53b has p+ diffusion layers 2a, 2b and 51, while the p+ diffusion layer 51 is in contact with the lower surface of the p+ diffusion layer 2b and encloses the overall lower portion of an emitter 4. The p+ diffusion layers 51 and 2b have higher impurity concentrations than the p+ diffusion layer 2a.

The remaining structure of this embodiment is substantially identical to that of the aforementioned first embodiment, and hence components of the second embodiment identical to those of the first embodiment are denoted by the same reference numerals, not to repeat redundant description.

Impurity concentration distributions in respective parts of the semiconductor device according to the second embodiment are now described.

Figure 16:
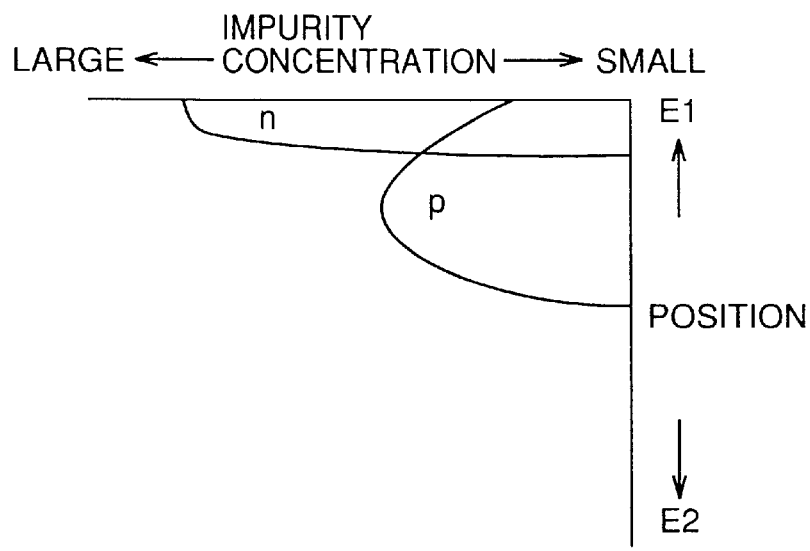
FIG. 16 illustrates the impurity concentration profile of a portion along the line E1–E2 in FIG. 15.
Figure 17:
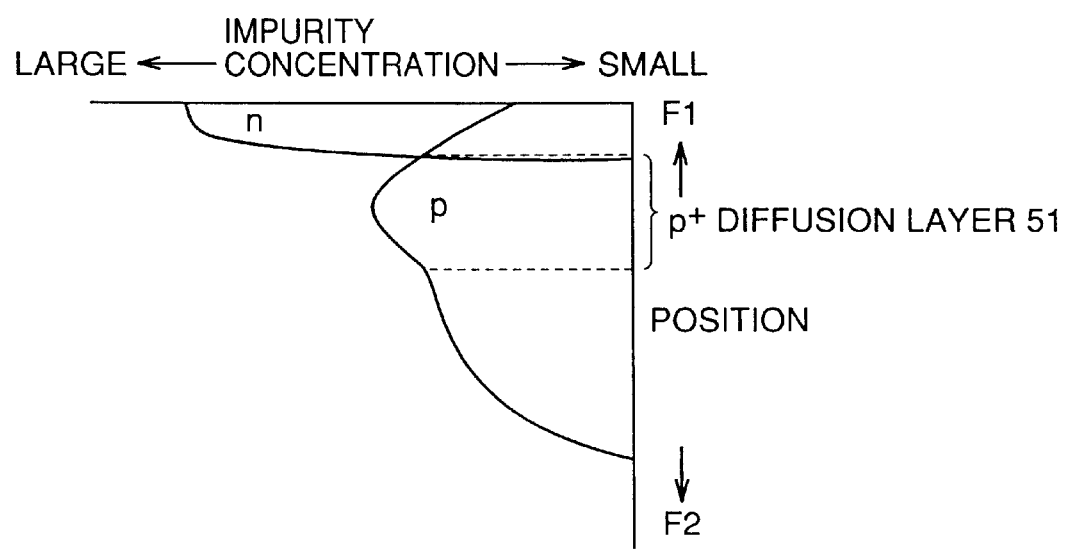
FIG. 17 illustrates the impurity concentration profile of a portion along the line F1–F2 in FIG. 15.

Referring to FIG. 16, the impurity concentration distribution of a portion along the line E1–E2 in FIG. 15 is defined only by that of the p+ diffusion layer 51 independently existing in this portion as a p-type region. Referring to FIG. 17, the impurity concentration distribution of a portion along the line F1–F2 in FIG. 15 is defined by those of the p+ diffusion layers 51 and 2a existing in this portion as p-type regions.

Figure 18:
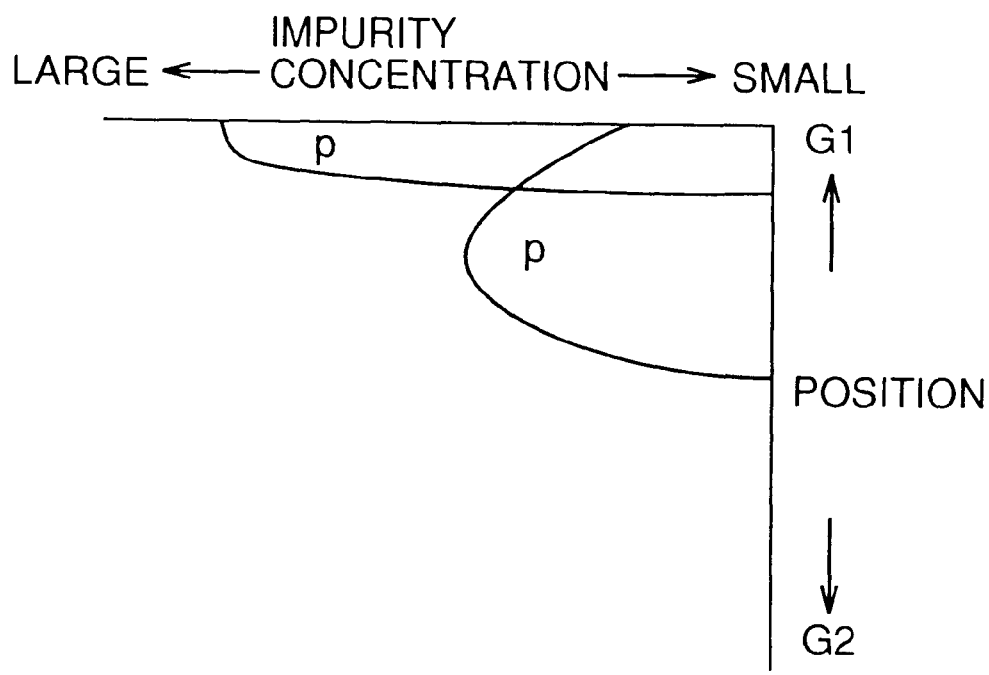
FIG. 18 illustrates the impurity concentration profile of a portion along the line G1–G2 in FIG. 15.

The impurity concentration distribution of a portion along the line G1–G2 in FIG. 15 is as shown in FIG. 18.

A method of fabricating the semiconductor device according to this embodiment is now described.

Figure 19:
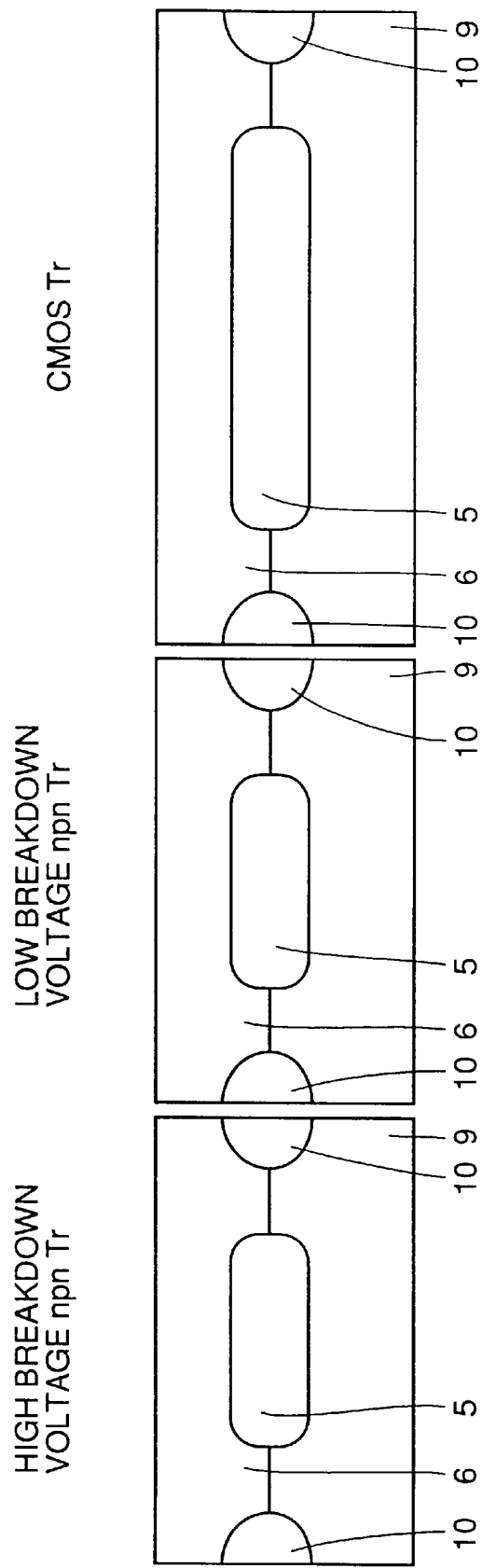
FIGS. 19 to 24 are schematic sectional views successively showing steps in a method of fabricating a semiconductor device according to the second embodiment of the present invention.

Referring to FIG. 19, the surface of a p-type silicon substrate 9 is oxidized for forming a silicon oxide film (not shown). The silicon oxide film is patterned by prescribed photolithography and working, for partially exposing the surface of the p-type silicon substrate 9. Antimony is injected into the exposed surface portions of the p-type silicon substrate 9 and thereafter heat treatment is performed at a temperature of about 1240° C. for forming n+ diffusion layers 5. Thereafter the silicon oxide film formed on the p-type silicon substrate 9 is removed.

Then, a silicon oxide film (not shown) of about several 10 nm in thickness is formed on the p-type silicon substrate 9 by CVD or the like. The silicon oxide film is patterned by prescribed photolithography and working, for partially exposing the surface of the p-type silicon substrate 9. Boron is injected into the exposed surface portions of the p-type silicon substrate 9 and thereafter heat treatment is performed at a temperature of about 1100° C. for forming p+ diffusion layers 10. Thereafter the silicon oxide film formed on the p-type silicon substrate 9 is removed.

Then, the n− epitaxial layer 6 of silicon is formed on the p-type silicon substrate 9 by epitaxy. At this time, the epitaxy is performed at a temperature of about 1150° C. and hence impurities contained in the n+ diffusion layers 5 and the p+ diffusion layers 10 are thermally diffused toward the n− epitaxial layer 6 with the growth of the n− epitaxial layer 6.

Figure 20:
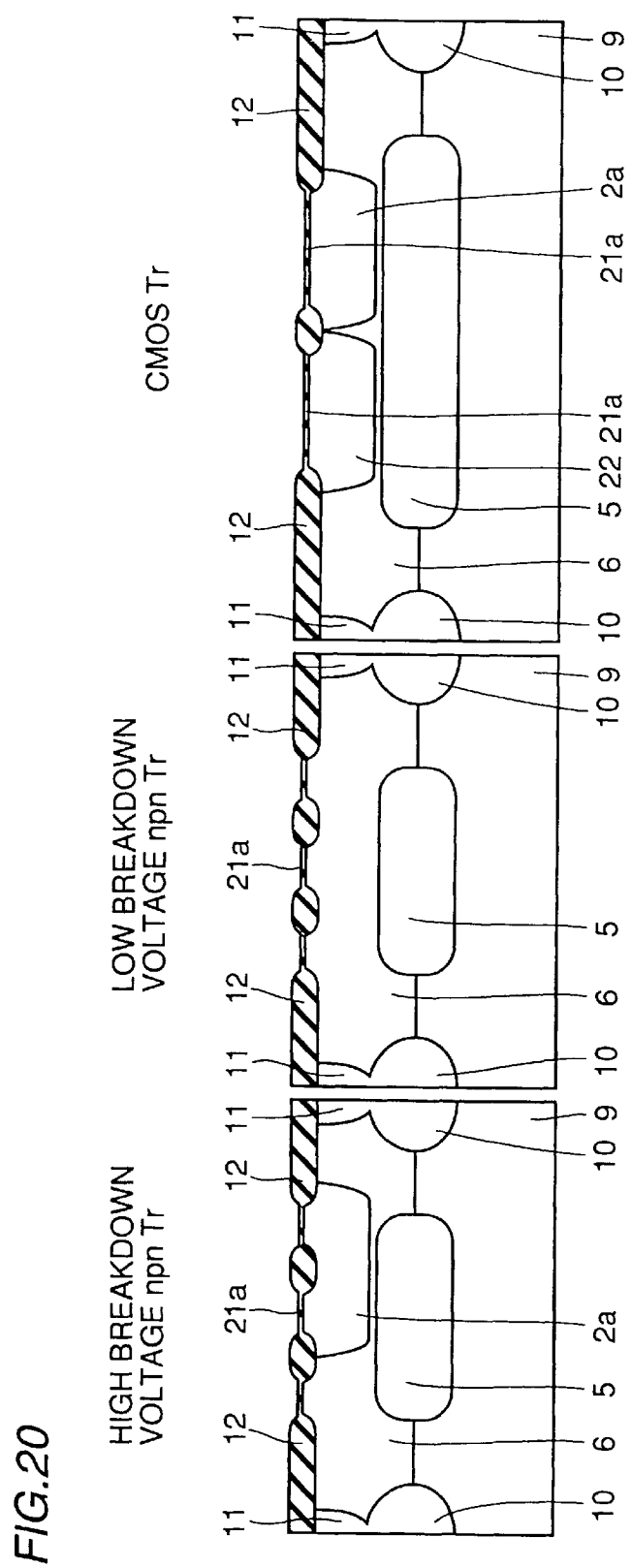

Referring to FIG. 20, a silicon oxide film (not shown) of about several 10 nm in thickness is formed on the n− epitaxial layer 6 by CVD or the like, and a silicon nitride film (not shown) is formed thereon by CVD or the like. The silicon nitride film is patterned by prescribed photolithography and working, for partially exposing the surface of the silicon oxide film.

Phosphorus is injected into the n− epitaxial layer 6 through the exposed surface portion of the silicon oxide film and thereafter thermal oxidation is performed at a temperature of about 950° C. for forming an n− diffusion layer 22 on a CMOS transistor region. The silicon nitride film is removed to expose the silicon oxide film located under the same.

Prescribed photolithography is performed on the exposed silicon oxide film for forming a photoresist pattern (not shown). The photoresist pattern is employed as a mask for injecting boron into prescribed regions of the n− epitaxial layer 6 and thereafter heat treatment is performed at a temperature of about 1180° C. for forming the p+ diffusion layers 2a on the high breakdown voltage npn bipolar transistor region and the CMOS transistor region and p+ diffusion layers 11 in isolation regions respectively. The photoresist pattern is removed by ashing, for example.

Then, the exposed silicon oxide film is removed thereby exposing the surfaces of the n− diffusion layer 22, the p+ diffusion layers 2a and the n− epitaxial layer 6. Silicon oxide films 21a of about several 10 nm in thickness are formed on the exposed surface portions, and silicon nitride films (not shown) are formed thereon. The silicon nitride films are patterned by prescribed photolithography and working, and thereafter heat treatment is performed for forming field oxide films 12 by the LOCOS method. Thereafter the silicon nitride films are removed.

Figure 21:
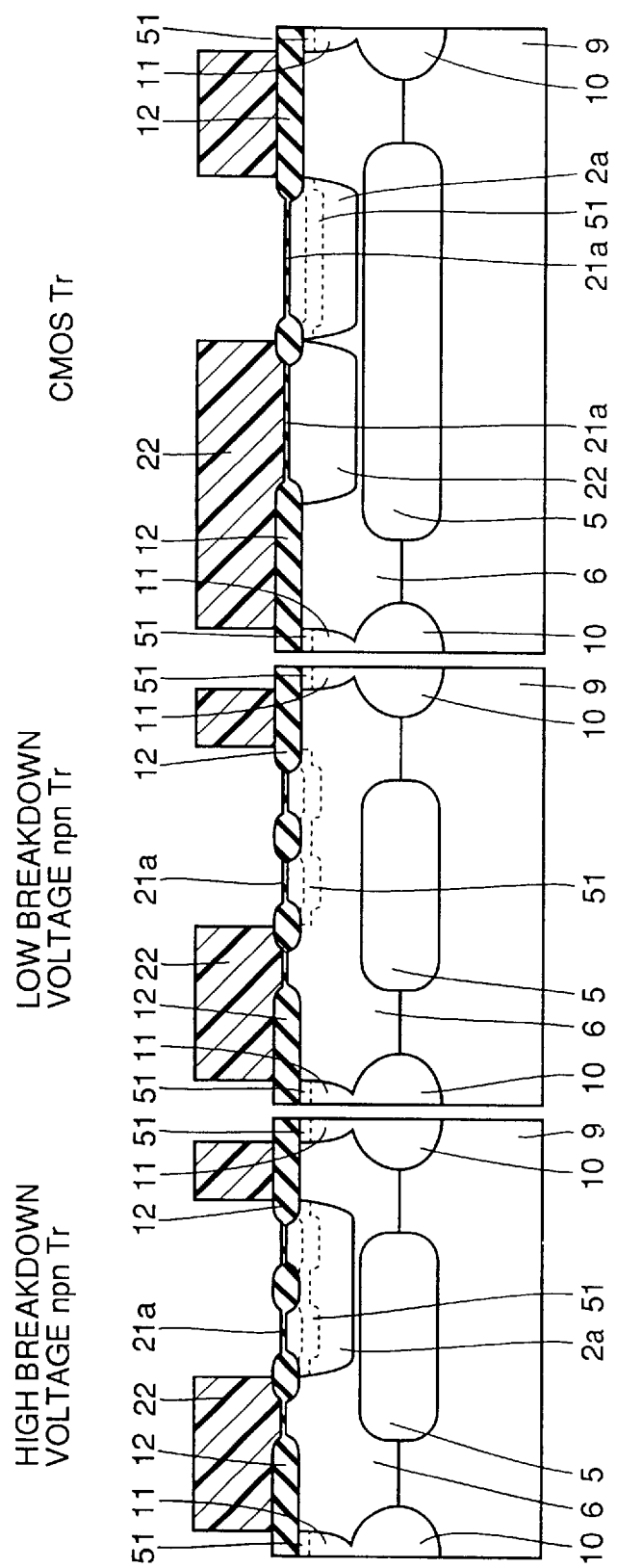

Referring to FIG. 21, a photoresist pattern 22 is formed by prescribed photolithography and thereafter employed as a mask for injecting boron, thereby forming the p+ diffusion layers 51 in the p+ diffusion layers 2a and 11 and the n− epitaxial layer 6.

At this time, the p+ diffusion layers 51, formed by ion-implanting the impurity into the surfaces formed with the field oxide films 12, reflect the steps between the field oxide films 12 and the silicon oxide films 21a. Therefore, the junction between the p+ diffusion layer 51 of the low breakdown voltage npn bipolar transistor and the n− epitaxial layer 6 has an irregular part reflecting an irregular shape formed by the upper surfaces of the field oxide film 12 and the silicon oxide film 21a. Thereafter the photoresist pattern 22 is removed by ashing, for example.

Then, the silicon oxide films 21a are removed to expose the surfaces of the p⁺ diffusion layers 2a, the n diffusion layer 22 and the n⁻ epitaxial layer 6. At this time, the surfaces of the field oxide films 12 are also removed by a thickness of about several 10 nm.

Figure 22:
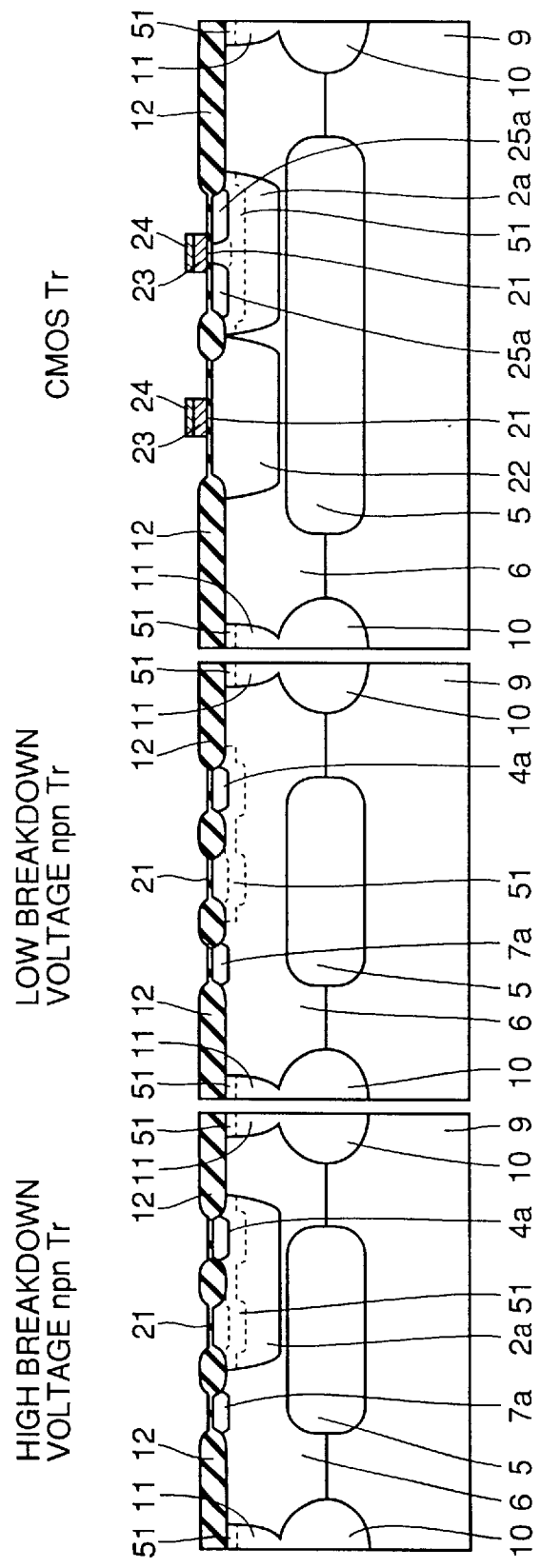

Referring to FIG. 22, thermal oxidation is performed for forming silicon oxide films 21 of about 10 to 50 nm in thickness on the exposed silicon surfaces.

A doped polysilicon film 23 is formed by CVD or the like to cover the overall surface, and a tungsten silicide film 24 is formed thereon by sputtering or the like. The tungsten silicide film 24 and the doped polysilicon film 23 are patterned by prescribed photolithography and working, for forming gate electrodes 23 and 24.

Then, a photoresist pattern (not shown) is formed on prescribed regions by photolithography and thereafter employed as a mask for injecting phosphorus by oblique ion rotational injection (angle of injection: about 45°). Thus, n⁻ diffusion layers 4a, 7a and 25a are formed.

Figure 23:
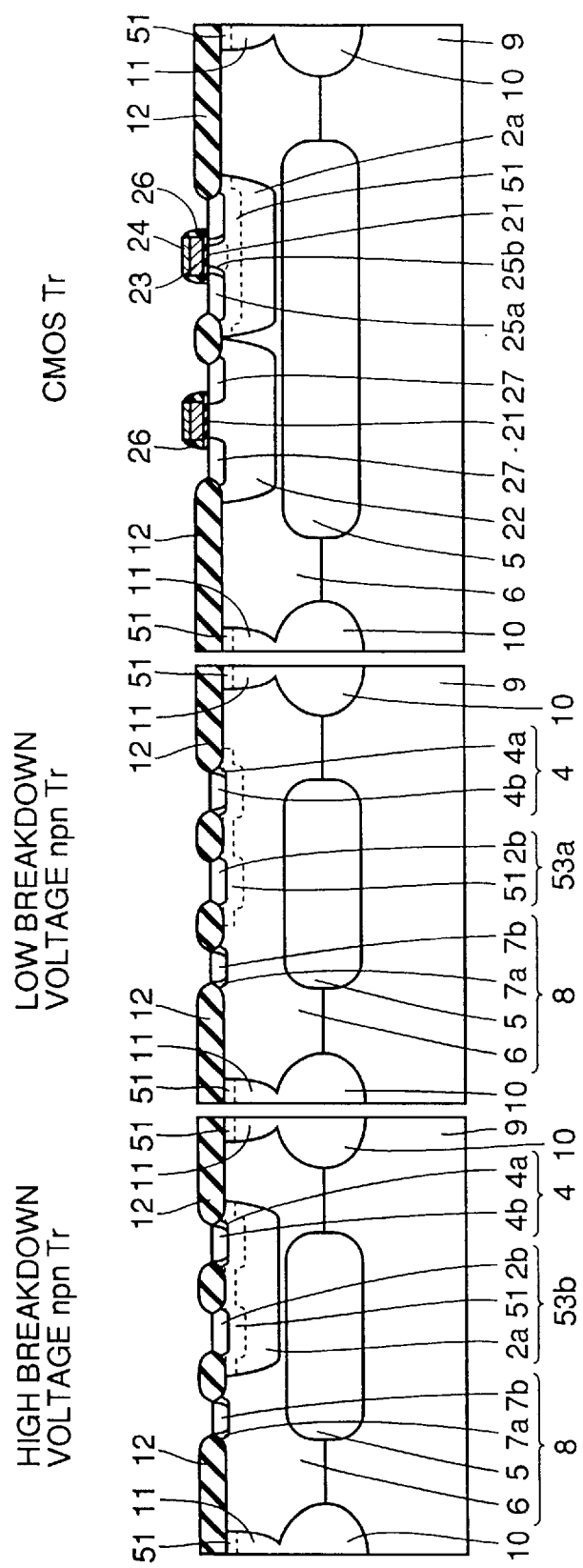

Referring to FIG. 23, a silicon oxide film 26 is formed by CVD or the like to cover the overall surface, and the overall surface thereof is anisotropically etched for forming side wall insulating layers 26 on the side walls of the gate electrodes 23 and 24. In this anisotropic etching, the silicon oxide films 21 are removed from regions formed with no field oxide films 12, to expose the silicon surfaces. In this state, the field oxide film 12 is formed on the surface of the p⁺ diffusion layer 51 of the low breakdown voltage npn bipolar transistor according to this embodiment.

Then, a photoresist pattern (not shown) is formed on prescribed regions and thereafter employed as a mask for injecting arsenic. The photoresist pattern is removed by ashing, for example, and thereafter heat treatment is performed in a nitrogen atmosphere at a temperature of about 900° C. for driving arsenic injected in the aforementioned manner and forming n⁻ diffusion layers. 4b, 7b and 25b.

Then, a photoresist pattern (not shown) is formed on prescribed regions and employed as a mask for injecting boron difluoride (BF₂). Thus, n⁻ diffusion layers 2b and 27 are formed. Thereafter the photoresist pattern is removed by ashing.

Thus formed are the low and high breakdown voltage npn bipolar transistors having collectors 8, the bases 53a and 53b and the emitters 4, and a CMOS transistor.

Figure 24:
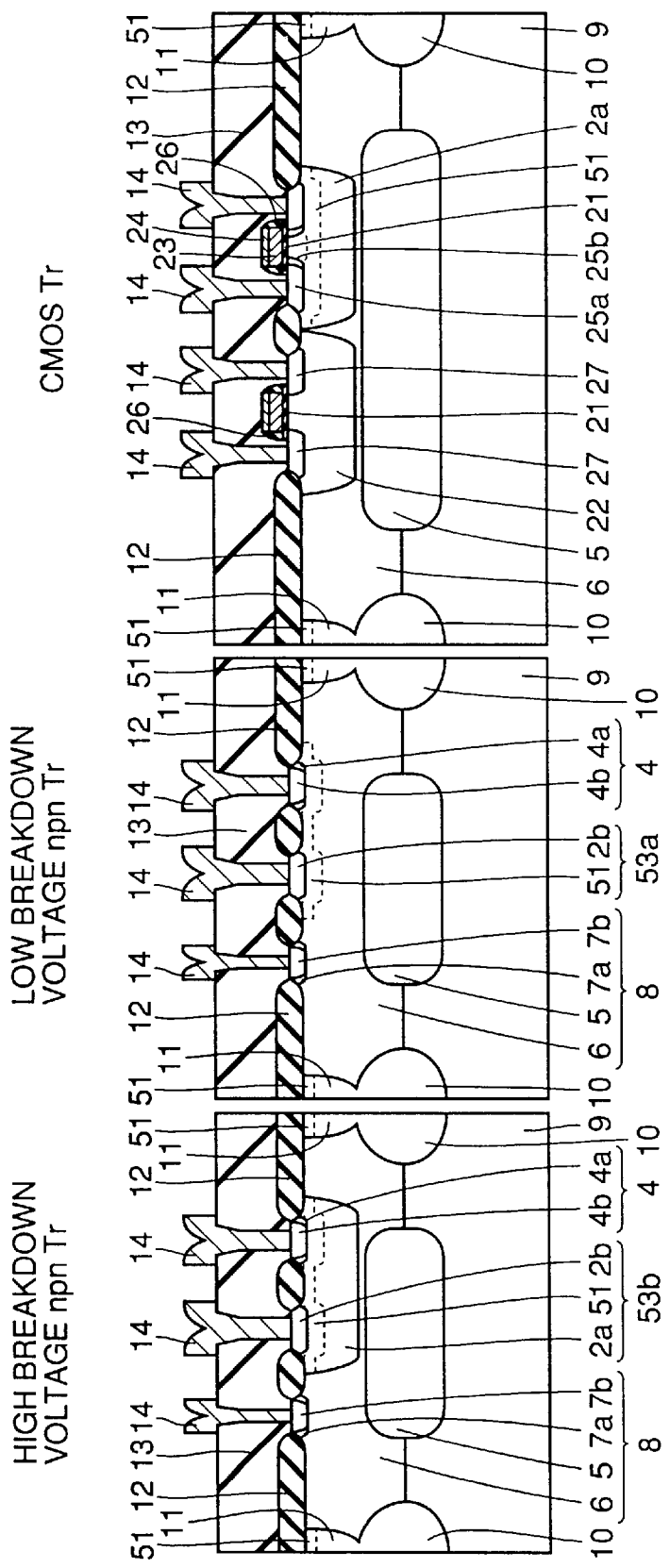

Referring to FIG. 24, an interlayer isolation layer 13 of a silicon oxide film or the like is formed on the overall surface by CVD or the like, to cover the respective transistors. The interlayer isolation layer 13 is patterned by prescribed photolithography and working, for forming contact holes therein. Thereafter an aluminum layer, for example, is deposited on the overall surface by sputtering and thereafter patterned by prescribed photolithography and working, for forming electrodes 13 coming into contact with the respective diffusion layers through the contact holes.

In the low breakdown voltage npn bipolar transistor of the prior art shown in FIG. 25, the p-type diffusion layer 130 must be formed after formation of the field oxide layer 112. Therefore, the field oxide film 112 cannot be formed on the surface of the p-type diffusion layer 130 held between the p⁺ diffusion layer 102b and the emitter 104.

The base 53a of the low breakdown voltage npn bipolar transistor according to this embodiment shown in FIG. 15 has no layer corresponding to the p-type diffusion layer 130 shown in FIG. 25. Therefore, the field oxide film 12 can be formed on the surface held between the p⁺ diffusion layer 2b and the emitter 4. In the step of heat treatment shown in FIG. 23 performed in a nitrogen atmosphere for forming the n⁺ diffusion layers 4b, 7b and 25b, therefore, the field oxide film 12 is located on the surface of the p⁺ diffusion layer 51 held between the p⁺ diffusion layer 2b and the emitter 4. Thus, boron can be prevented from evaporating from the region of the p⁺ diffusion layer 51 held between the p⁺ diffusion layer 2b and the emitter 4, and increase of dispersion of the current amplification factor $h_{FE}$ in the wafer plane can be suppressed.

According to this embodiment, no layer corresponding to the p-type diffusion layer 130 shown in FIG. 25 is provided and hence the fabrication steps can be simplified.

The inventors have investigated the distribution in the wafer plane of the current amplification factor $h_{FE}$ ($I_C$=50 µA) of the low breakdown voltage npn bipolar transistor having the structure according to this embodiment. Table 4 shows the results.

TABLE 4

$h_{FE}$ (Current Amplification Factor)
1c = 50 A

| | $h_{FE}$ |
|---|---|
| Measuring Portion 1 | 106 |
| Measuring Portion 2 | 105 |
| Measuring Portion 3 | 99 |
| Measuring Portion 4 | 100 |
| Measuring Portion 5 | 111 |

It has been confirmed through these results that in-plane dispersion of the current amplification factor $h_{FE}$ characteristic is reduced according to this embodiment as compared with the current amplification factor $h_{FE}$ in the conventional structure shown in Table 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having low and high breakdown voltage transistors formed on a major surface of a semiconductor substrate, wherein said low breakdown voltage transistor includes:
a field insulating layer formed on said major surface, first and second sides of said major surface holding at least a part of said field insulating layer between respective edges of said first and second sides adjacent to said part of said field insulating layer,
a base first impurity region of a first conductivity type formed in the first side of said major surface,
an emitter first impurity region of a second conductivity type formed in the second side of said major surface, and
a base second impurity region of a first conductivity type located between said base first impurity region and said emitter first impurity region, wherein said field insulating layer covers a portion of said base second impurity region, said base second impurity region being formed in said major surface to at least partially surround said base first impurity region and said emitter first impurity region and having a lower impurity concentration than said base first impurity region, and said low breakdown voltage transistor further includes:

a base third impurity region of a first conductivity type at least partially surrounding said emitter first impurity region in said major surface and surrounded by said base second impurity region, said base third impurity region having an opening completely filled with said base second impurity region, said base third impurity region having a higher impurity concentration than said base second impurity region, wherein said emitter first impurity region covers at least a portion of said opening.

2. The semiconductor device according to claim 1, wherein said low breakdown voltage transistor withstands a voltage of less than 30 V, and said high breakdown voltage transistor withstands a voltage of at least 30 V.

3. The semiconductor device according to claim 1, wherein said high breakdown voltage transistor includes:

a base fourth impurity region of a first conductivity type formed in said major surface, an emitter second impurity region of a second conductivity type formed in said major surface at a space from said base fourth impurity region, a base fifth impurity region of a first conductivity type formed in said major surface to at least partially surround said base fourth impurity region and said emitter second impurity region and to be substantially identical in diffusion depth to said base second impurity region and having a lower impurity concentration than said base fourth impurity region, and a base sixth impurity region of a first conductivity type at least partially surrounding the periphery of said emitter second impurity region and having a higher impurity concentration than said base fifth impurity region.

4. The semiconductor device according to claim 1, wherein said base second impurity region at least partially surrounds a portion of said emitter first impurity region located under said major surface and is electrically connected to said base first impurity region, said low breakdown voltage transistor further includes a collector impurity region of a second conductivity type in contact with said base second impurity region, and the junction between said base second impurity region and said collector impurity region has a shape formed by said first side of said major surface, said second side of said major surface and the upper surface of at least said part of said field insulating layer.

5. The semiconductor device according to claim 4 wherein said high breakdown voltage transistor includes:

a base third impurity region of a first conductivity type formed in said major surface, an emitter second impurity region of a second conductivity type formed in said major surface at a space from said base third impurity region, a base fourth impurity region of a first conductivity type formed in said major surface to at least partially surround said base third impurity region and said emitter second impurity region and having a lower impurity concentration than said base third impurity region, and a base fifth impurity region of a first conductivity type at least partially surrounding the periphery of said emitter second impurity region and having a higher impurity concentration than said base fourth impurity region.

* * * * *